US012580022B2

(12) United States Patent
Kwon et al.

(10) Patent No.: US 12,580,022 B2
(45) Date of Patent: Mar. 17, 2026

(54) BLOCK SELECTION CIRCUIT CONTROLLING SERIES—CONNECTED PASS TRANSISTORS USING SHARED SWITCH CIRCUIT AND FLASH MEMORY INCLUDING THE SAME

(71) Applicant: SAMSUNG ELECTRONICS CO., LTD., Suwon-si (KR)

(72) Inventors: Tae-Hong Kwon, Suwon-si (KR); Gyosoo Choo, Suwon-si (KR); Cheon An Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/975,798

(22) Filed: Dec. 10, 2024

(65) Prior Publication Data

US 2025/0266092 A1     Aug. 21, 2025

(30) Foreign Application Priority Data

Feb. 19, 2024    (KR) ........................ 10-2024-0023736

(51) Int. Cl.
| | |
|---|---|
| *G11C 16/08* | (2006.01) |
| *G11C 16/04* | (2006.01) |
| *G11C 16/16* | (2006.01) |

(52) U.S. Cl.
CPC .......... *G11C 16/08* (2013.01); *G11C 16/0483* (2013.01); *G11C 16/16* (2013.01)

(58) Field of Classification Search
CPC ..... G11C 16/08; G11C 16/0483; G11C 16/10; G11C 16/16; G11C 8/12; G11C 16/26; G11C 16/30; G11C 7/18; G11C 8/08; G11C 16/14
See application file for complete search history.

(56) References Cited

U.S. PATENT DOCUMENTS

| | | | |
|---|---|---|---|
| 8,520,445 B2 | 8/2013 | Koo | |
| 9,721,667 B2 | 8/2017 | Son et al. | |
| 9,818,483 B2 | 11/2017 | Hahn et al. | |
| 9,972,397 B2 | 5/2018 | Lee | |
| 10,176,879 B2 | 1/2019 | Lee et al. | |
| 10,714,183 B2 | 7/2020 | Kim et al. | |
| 11,430,519 B2 | 8/2022 | Passerini et al. | |
| 2010/0238729 A1* | 9/2010 | Lee ..................... | G11C 11/5628 |
| | | | 365/185.11 |
| 2011/0267885 A1* | 11/2011 | Kato ........................ | G11C 8/08 |
| | | | 365/185.11 |
| 2017/0084339 A1* | 3/2017 | Son ........................ | G11C 16/08 |
| 2025/0095745 A1* | 3/2025 | Kwon ................ | G11C 16/0483 |

* cited by examiner

*Primary Examiner* — Jay W. Radke
(74) *Attorney, Agent, or Firm* — Sughrue Mion, PLLC

(57) ABSTRACT

A block selection circuit of a flash memory, includes: a first pass transistor connected to an address decoder; a second pass transistor connected in series with the first pass transistor; a first driver circuit configured to control a gate voltage of the first pass transistor based on a first enable signal; a second driver circuit to control a gate voltage of the second pass transistor based on a second enable signal; a first switch circuit to provide a first power voltage or a second power voltage to a gate of the first pass transistor through the first driver circuit based on a first switch signal; and a second switch circuit to share a plurality of memory blocks and provide the first power voltage or the second power voltage to the first switch circuit.

20 Claims, 28 Drawing Sheets

| Selected BLK (sBLK) | READ | PROGRAM | ERASE |
|---|---|---|---|
| SW1 | ON | ON | ON |
| SW2 | OFF | OFF | OFF |
| SW3 | ON | ON | ON |
| SW4 | OFF | OFF | OFF |
| EN1 | L | L | L |
| EN2 | L | L | L |
| N3 | VPP | VPP | VPP |
| N7 | VPP | VPP | VPP |
| sWL | Vrd | Vpgm | Vers |
| uWL | Vrdps | Vpass | Vers |

FIG.13

| Unselected BLK (uBLK) | READ | PROGRAM | ERASE |
|---|---|---|---|
| SW1 | OFF | OFF | OFF |
| SW2 | ON | ON | ON |
| SW3 | OFF | OFF | OFF |
| SW4 | ON | ON | ON |
| EN1 | H | L | H |
| EN2 | H | H | L |
| N3 | L | VFRT | L |
| N7 | L | L | VFRT |
| WLk | Floating | Floating | Coupling |

FIG.15

| OPQR | fPGM (fERS) | OR | NOR |
|------|-------------|-----|-----|
| L | L | L | H |
| H | L | H | L |
| L | H | H | L |
| H | H | H | L |

FIG.16

| | sBLK | | | uBLK | | |
|---|---|---|---|---|---|---|
| | READ | PROGRAM | ERASE | READ | PROGRAM | ERASE |
| OPQR | H | H | H | L | L | L |
| fPGM | L | H | L | L | H | L |
| fERS | L | L | H | L | L | H |
| EN1 | L | L | L | H | L | H |
| EN2 | L | L | L | H | H | L |
| PA_Gate | VPP | VPP | VPP | 0 | VFRT | 0 |
| PB_Gate | VPP | VPP | VPP | 0 | 0 | VFRT |

FIG.22

|  | PS1 (sBLK) | PS3 (uBLK) | SW1 | SW2 | SW3 | SW4 |
|---|---|---|---|---|---|---|
| Ta | VFRT | VFRT | ON | ON | OFF | ON |
| Tb | VPP | VFRT | ON | OFF | ON | OFF |
| Tc | VRCY | VRCY | ON | ON | OFF | OFF |

BLOCK SELECTION CIRCUIT CONTROLLING SERIES—CONNECTED PASS TRANSISTORS USING SHARED SWITCH CIRCUIT AND FLASH MEMORY INCLUDING THE SAME

CROSS-REFERENCE TO RELATED APPLICATION

This application claims priority under 35 U.S.C. § 119 to Korean Patent Application No. 10-2024-0023736, filed on Feb. 19, 2024, in the Korean Intellectual Property Office, the disclosure of which is incorporated by reference herein in its entirety.

BACKGROUND

1. Field

The disclosure relates to a semiconductor memory device, and more particularly, to a block selection circuit configured to control pass transistors connected in series using a shared switch circuit, and a flash memory including the same.

2. Description of Related Art

A semiconductor memory may be mainly classified as a volatile memory or a non-volatile memory. Read and write speeds of the volatile memory (e.g., a dynamic random access memory (DRAM) or a static random access memory (SRAM)) are fast, but the data stored in the volatile memory disappear when a power is turned off. In contrast, the non-volatile memory may retain data even when the power is turned off.

A representative example of the non-volatile memory is a flash memory. The flash memory may store multi-bit data of two or more bits in one memory cell. The flash memory (that stores the multi-bit data) may have one erase state and a plurality of program states depending on threshold voltage distributions.

The flash memory may include a plurality of memory blocks. Each memory block may include a plurality of pages. The flash memory may perform an erase operation on a basis of a memory block and the flash memory may read or program an operation on a basis of a page. Each memory block may be connected to a block selection circuit through a plurality of word lines. In the related art, the block selection circuit may include a pass transistor connected to each word line and a driver circuit for driving the block selection circuit.

Since the block selection circuit of the related art includes one pass transistor for each word line, the block selection circuit of the related art may be vulnerable to high voltages such as a program voltage (applied during a program operation) or an erase body voltage (applied during an erase operation). The flash memory may need to be enlarged in a size, thus pass transistors of the enlarged flash memory can be durable at high voltages. However, as the size of the flash memory increases, a cost to manufacture the flash memory would also increase.

SUMMARY

Provided are a block selection circuit including a pass transistor structure that is durable against high voltages and that reduces an overall area, and a flash memory including the same block selection circuit.

According to an aspect of the disclosure, a flash memory includes: a plurality of memory blocks, each of the plurality of memory blocks being connected to a plurality of word lines; an address decoder configured to provide voltage to unselected word lines and a selected word line; a first pass transistor connected to the address decoder; a second pass transistor connected in series with the first pass transistor, the second pass transistor being connected to a word line among the plurality of word lines; a first driver circuit configured to control a gate voltage of the first pass transistor based on a first enable signal; a second driver circuit configured to control a gate voltage of the second pass transistor based on a second enable signal; a first switch circuit configured to provide a first power voltage or a second power voltage to a gate of the first pass transistor through the first driver circuit based on a first switch signal; and a second switch circuit configured to be shared by the plurality of memory blocks and provide the first power voltage or the second power voltage to the first switch circuit, wherein the first power voltage is higher than the second power voltage.

According to an aspect of the disclosure, a block selection circuit of a flash memory, includes: a first pass transistor connected to an address decoder; a second pass transistor connected in series with the first pass transistor; a first driver circuit configured to control a gate voltage of the first pass transistor based on a first enable signal; a second driver circuit configured to control a gate voltage of the second pass transistor based on a second enable signal; a first switch circuit configured to provide a first power voltage or a second power voltage to a gate of the first pass transistor through the first driver circuit based on a first switch signal; and a second switch circuit configured to be shared by a plurality of memory blocks and provide the first power voltage or the second power voltage to the first switch circuit, wherein the first power voltage is higher than the second power voltage.

According to an aspect of the disclosure, a block selection circuit of a flash memory, includes: a first pass transistor connected to an address decoder; a second pass transistor connected in series with the first pass transistor; a first driver circuit configured to control a gate voltage of the first pass transistor based on a first enable signal; a second driver circuit configured to control a gate voltage of the second pass transistor based on a second enable signal; a switch circuit configured to provide a first power voltage or a second power voltage lower than the first power voltage to a gate of the first pass transistor through the first driver circuit based on a first switch signal; a first shared switch circuit configured to share a plurality of memory blocks and provide the first power voltage or the second power voltage to the switch circuit; and a second shared switch circuit configured to be shared by the plurality of memory blocks and provide the first power voltage or the second power voltage to the gate of the second pass transistor through the second driver circuit, wherein, when a memory block connected to the second pass transistor is a selected memory block, during a program operation, the first driver circuit is further configured to control the gate voltage of the first pass transistor to change from the second power voltage to the first power voltage, and the second driver circuit is further configured to control the first power voltage to be provided to the gate of the second pass transistor.

BRIEF DESCRIPTION OF THE DRAWINGS

The above and other objects and features of the disclosure will become apparent by describing in detail embodiments thereof with reference to the accompanying drawings:

FIGS. 7 and 8 are a circuit diagram and a table, respectively, illustrating bias conditions of the block selection circuit shown in FIG. 6;

FIG. 13 is a table illustrating bias conditions for the unselected memory block;

FIGS. 14 to 16 are a circuit diagram and tables, respectively, illustrating example embodiments of a method of generating switch signals and enable signals shown in FIG. 2;

FIG. 22 is a diagram illustrating example embodiments of the gate voltages of the first and third pass transistors and the on/off conditions of the first to fourth switch signals in the time periods shown in FIG. 21;

DETAILED DESCRIPTION

Figure 1:
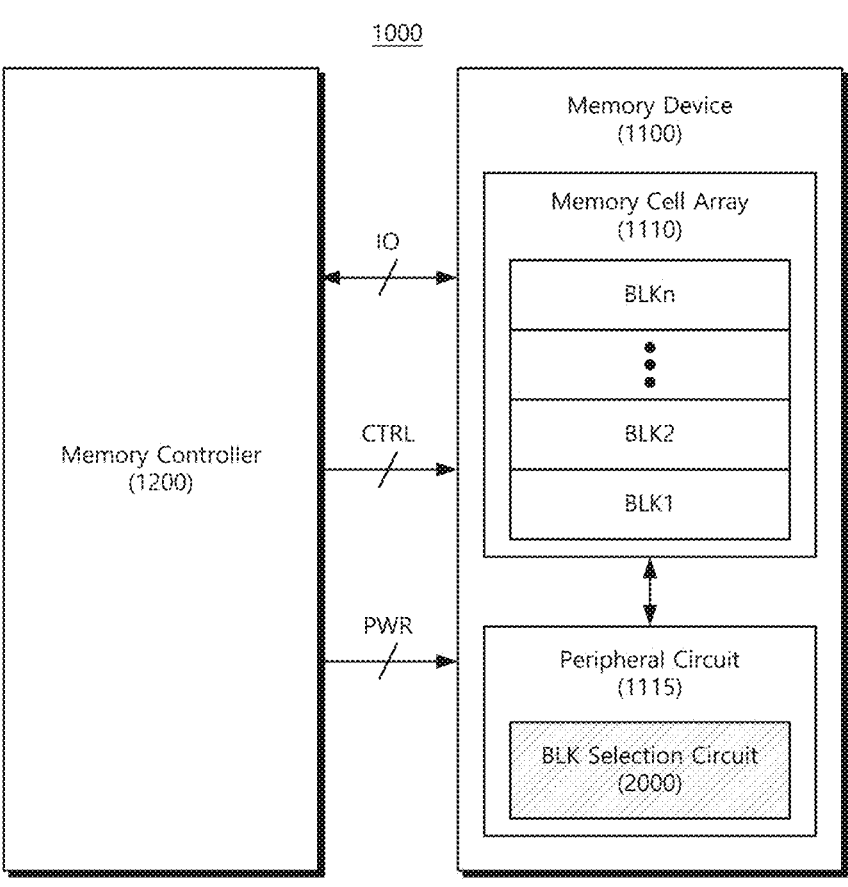
FIG. 1 is a block diagram illustrating an example embodiment of a storage device according to the disclosure.

Below, example embodiments of the disclosure will be described in detail and clearly to such an extent that an ordinary one in the art easily implements the inventive concepts.

The description merely illustrates the principles of the disclosure. Those skilled in the art will be able to devise one or more arrangements that, although not explicitly described herein, embody the principles of the disclosure. Furthermore, all examples recited herein are principally intended expressly to be only for explanatory purposes to help the reader in understanding the principles of the disclosure and the concepts contributed by the inventor to furthering the art and are to be construed as being without limitation to such specifically recited examples and conditions. Moreover, all statements herein reciting principles, aspects, and embodiments of the disclosure, as well as specific examples thereof, are intended to encompass equivalents thereof.

Terms used in the disclosure are used only to describe a specific embodiment, and may not be intended to limit the scope of another embodiment. A singular expression may include a plural expression unless it is clearly meant differently in the context. The terms used herein, including a technical or scientific term, may have the same meaning as generally understood by a person having ordinary knowledge in the technical field described in the disclosure. Terms defined in a general dictionary among the terms used in the disclosure may be interpreted with the same or similar meaning as a contextual meaning of related technology, and unless clearly defined in the disclosure, it is not interpreted in an ideal or excessively formal meaning. In some cases, even terms defined in the disclosure cannot be interpreted to exclude embodiments of the disclosure.

In one or more embodiments of the disclosure described below, a hardware approach is described as an example. However, since the one or more embodiments of the disclosure include technology that uses both hardware and software, the various embodiments of the disclosure do not exclude a software-based approach.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with 'more than', a condition described as 'less than or equal to' may be replaced with 'less than', and a condition described as 'more than or equal to and less than' may be replaced with 'more than and less than or equal to'.

The terms "include" and "comprise", and the derivatives thereof refer to inclusion without limitation. The term "or" is an inclusive term meaning "and/or". The phrase "associated with," as well as derivatives thereof, refer to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" (for example, a memory controller) refers to any device, system, or part thereof that controls at least one operation. The functionality associated with any particular controller may be centralized or distributed, whether locally or remotely. The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C, and any variations thereof. As an additional example, the expression "at least one of a, b, or c" may indicate only a, only b, only c, both a and b, both a and c, both b and c, all of a, b, and c, or variations thereof. Similarly, the term "set" means one or more. Accordingly, the set of items may be a single item or a collection of two or more items.

FIG. 1 is a block diagram illustrating an example embodiment of a storage device according to the disclosure. The storage device 1000 may be a flash storage device based on a flash memory. For example, the storage device 1000 may be implemented as a solid-state drive (SSD), a universal flash storage (UFS), a memory card, or the like.

Referring to FIG. 1, the storage device 1000 may include a memory device 1100 and a memory controller 1200. The memory device 1100 may receive input/output signals IO from the memory controller 1200 through input/output lines, receive control signals CTRL through control lines, and receive external power supply PWR through power lines. The storage device 1000 may store data in the memory device 1100 under the control of the memory controller 1200.

The memory device 1100 may include a memory cell array 1110 and a peripheral circuit 1115. The memory cell array 1110 may include a plurality of memory blocks BLK1 to BLKn. Each memory block may have a vertical 3D structure. Each memory block may include a plurality of memory cells. Multi-bit data may be stored in each memory cell.

The memory cell array 1110 may be located (e.g., disposed) next to or above the peripheral circuit 1115 in terms of the design layout structure. A structure in which the memory cell array 1110 is positioned over the peripheral circuit 1115 may be referred to as a cell on peripheral (COP) structure.

In an example embodiment, the memory cell array 1110 may be manufactured as a chip separate from the peripheral circuit 1115. An upper chip including the memory cell array 1110 and a lower chip including the peripheral circuit 1115 may be connected to each other by a bonding method. Such a structure may be referred to as a chip-to-chip (C2C) structure.

The peripheral circuit 1115 may include analog circuits and/or digital circuits required to store data in the memory cell array 1110 or read data stored in the memory cell array 1110. The peripheral circuit 1115 may receive the external power PWR through power lines and generate internal powers of various levels.

The peripheral circuit 1115 may receive commands, addresses, and/or data from the memory controller 1200 through input/output lines. The peripheral circuit 1115 may store data in the memory cell array 1110 according to the control signals CTRL. Alternatively or additionally, the peripheral circuit 1115 may read data stored in the memory cell array 1110 and provide the read data to the memory controller 1200.

The peripheral circuit 1115 may include a block selection circuit 2000. The block selection circuit 2000 may include two or more pass transistors connected in series to one word line. Hereinafter, a structure in which two or more pass transistors are connected in series is referred to as a series-connected pass transistor.

The memory device 1100 according to example embodiments of the disclosure may enhance high voltage durability during program or erase operations by using a series-connected pass transistor. The memory device 1100 may distribute the influence of high voltage applied to one existing pass transistor to two pass transistors. Therefore, the disclosure may reduce the size of individual pass transistors.

Figure 2:
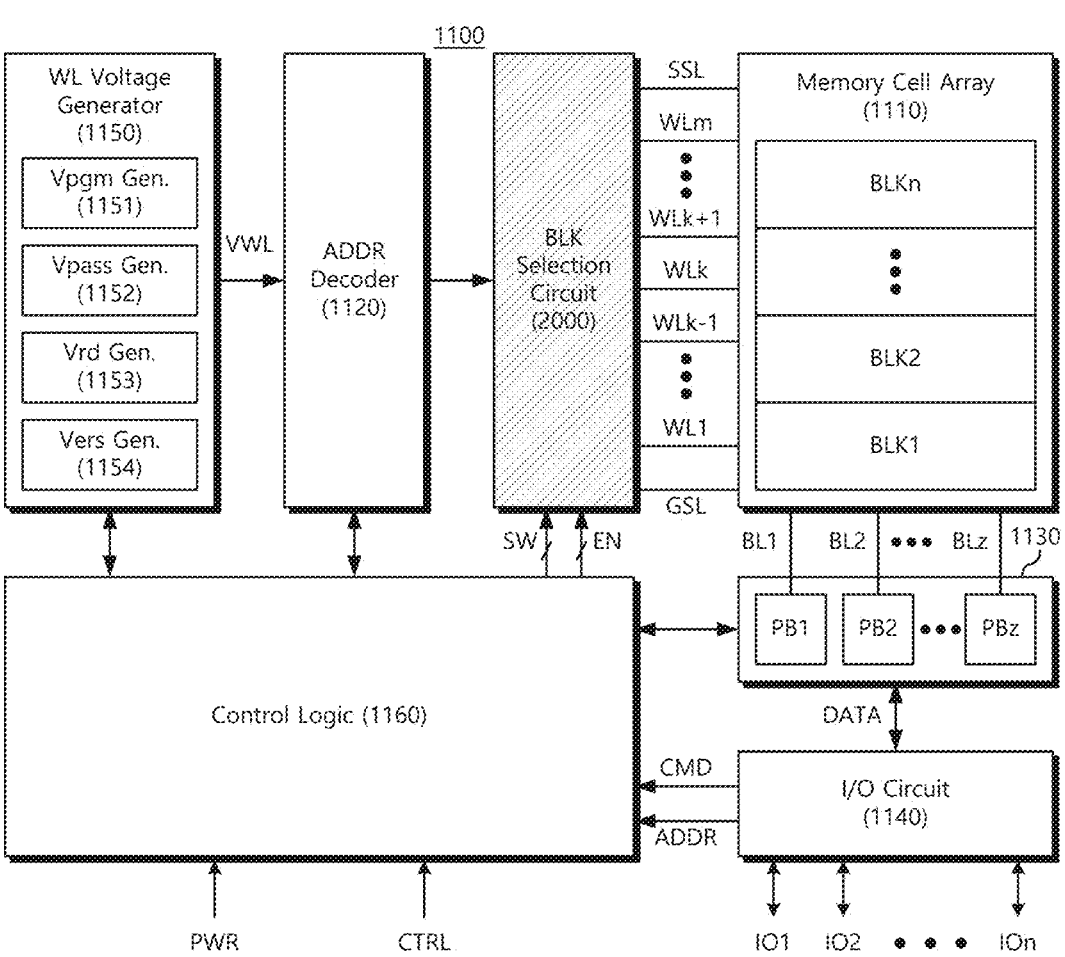
FIG. 2 is a block diagram illustrating as an example embodiment of the memory device illustrated in FIG. 1.

FIG. 2 is a block diagram illustrating as an example embodiment of the memory device illustrated in FIG. 1. Referring to FIG. 2, the memory device 1100 may include the memory cell array 1110 and the peripheral circuit 1115 (see FIG. 1). The peripheral circuit 1115 may include an address decoder 1120, a page buffer circuit 1130, an input/output (I/O) circuit 1140, a word line voltage generator 1150, and a control logic 1160.

The memory cell array 1110 may include a plurality of memory blocks BLK1 to BLKn. Each memory block may be composed of a plurality of pages. Each page may include a plurality of memory cells. Each memory cell may store multi-bit data (e.g., two or more bits). Each memory block may correspond to an erase unit, and each page may correspond to a read and/or write unit.

The memory cell array 1110 may be formed in a direction perpendicular to a substrate. A gate electrode layer and an insulation layer may be alternately deposited on the substrate. Each memory block (e.g., BLK1) may be connected to one or more string selection lines SSL, a plurality of word lines WL1 to WLm, and one or more ground selection lines GSL. WLk is a selected word line sWL and the remaining word lines (WL1 to WLk−1, WLk+1 to WLm) are unselected word lines uWL.

The address decoder 1120 may be connected to the memory cell array 1110 through selection lines SSL and GSL and word lines WL1 to WLm. The address decoder 1120 may select a word line during a program or read operation. The address decoder 1120 may receive the word line voltage VWL from the word line voltage generator 1150 and provide a program voltage or read voltage to the selected word line.

The page buffer circuit 1130 may be connected to the memory cell array 1110 through bit lines BL1 to BLz. The page buffer circuit 1130 may temporarily store data to be stored in the memory cell array 1110 or data read from the memory cell array 1110. The page buffer circuit 1130 may include page buffers PB1 to PBz connected to respective bit lines. Each page buffer may include a plurality of latches to store or read multi-bit data.

The I/O circuit 1140 may be internally connected to the page buffer circuit 1130 through data lines and externally connected to the memory controller (refer to FIG. 1, 1200) through the input/output lines IO1 to IOn. The I/O circuit 1140 may receive program data from the memory controller 1200 during a program operation. Also, the I/O circuit 1140 may provide data read from the memory cell array 1110 to the memory controller 1200 during a read operation.

The word line voltage generator 1150 may receive internal power from the control logic 1160 and generate a word line voltage VWL required to read or write data. The word line voltage VWL may be provided to a selected word line sWL or unselected word lines uWL through the address decoder 1120.

The word line voltage generator 1150 may include a program voltage generator 1151 and a pass voltage generator 1152. The program voltage generator 1151 may generate a program voltage Vpgm provided to the selected word line sWL during a program operation. The pass voltage generator 1152 may generate a pass voltage Vpass provided to the selected word line sWL and the unselected word lines uWL.

The word line voltage generator 1150 may include a read voltage generator 1153 and a read pass voltage generator 1154. The read voltage generator 1153 may generate a select read voltage Vrd provided to the select word line sWL during a read operation. The read pass voltage generator 1154 may generate a read pass voltage Vrdps provided to unselected word lines uWL. The read pass voltage Vrdps may be a voltage sufficient to turn on memory cells connected to the unselected word lines uWL during a read operation.

The control logic 1160 may control operations such as read, write, and erase of the memory device 1100 using commands CMD, addresses ADDR, and control signals CTRL provided from the memory controller 1200. The addresses ADDR may include a block selection address for selecting one memory block, a row address for selecting one page, and a column address for selecting one memory cell.

The block selection circuit 2000 may be connected between the memory cell array 1110 and the address decoder 1120. The block selection circuit 2000 may include pass transistors connected in series to one word line. The block selection circuit 2000 may effectively protect the series-connected pass transistor from the program voltage Vpgm applied during a program operation or the erase body voltage VERS applied during an erase operation. The block selection circuit 2000 may include a pass transistor driver circuit for driving series-connected pass transistors. The pass transistor driver circuit may individually control series-connected pass transistors.

The control logic 1160 may provide switch signals SW and enable signals EN to control the pass transistor driver circuit of the block selection circuit 2000. The switch signals SW and enable signals EN may be generated using an address ADDR and command CMD. For example, the control logic 1160 may generate switch signals SW using a block address. Additionally, the control logic 1160 may generate enable signals EN during a program operation using a block address and a program start signal. The control logic 1160 may generate enable signals EN during an erase operation using the block address and an erase start signal.

Figure 3:
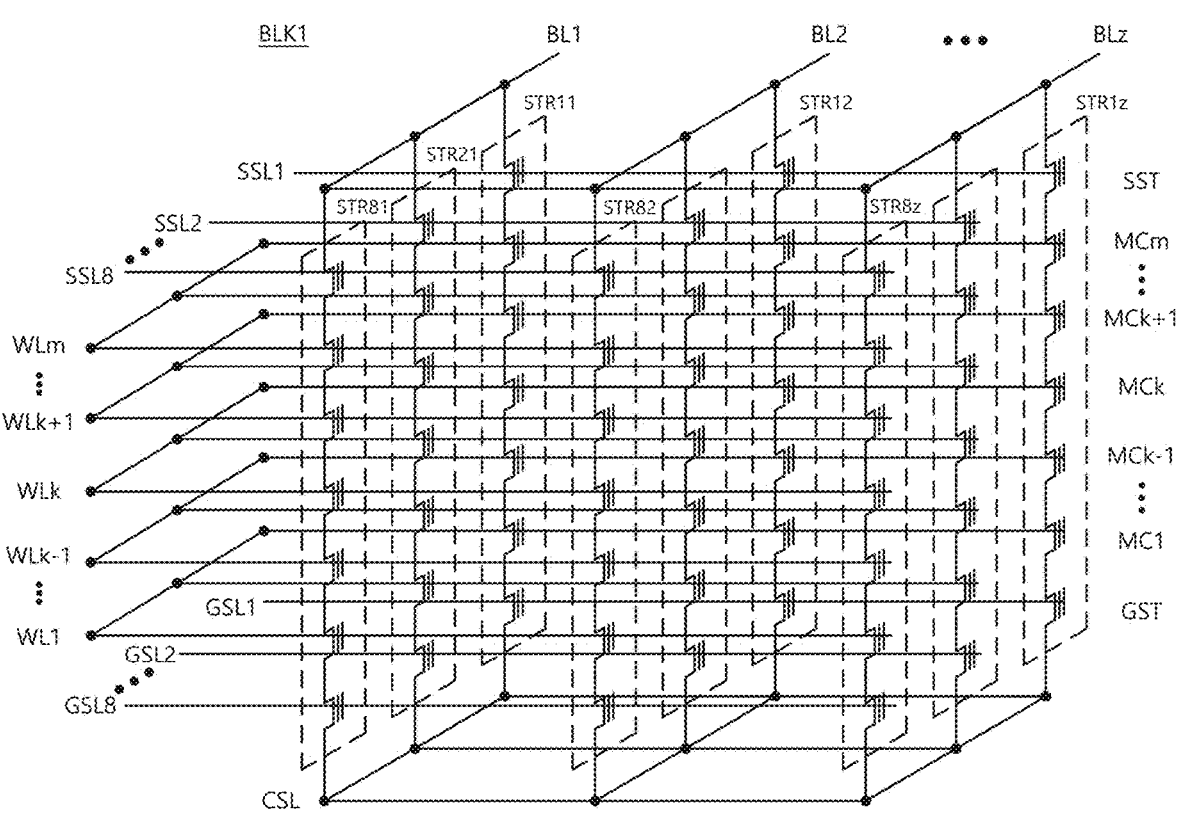
FIG. 3 is a circuit diagram illustrating an example embodiment of a memory block BLK1 of the memory cell array illustrated in FIG. 2.

FIG. 3 is a circuit diagram illustrating an example embodiment of a memory block BLK1 of the memory cell array illustrated in FIG. 2. Referring to FIG. 3, in the memory block BLK1, a plurality of cell strings STR11 to STR8z may be formed between the bit lines BL1 to BLz and a common source line CSL. Each cell string includes a string selection transistor SST, a plurality of memory cells MC1 to MCm, and a ground selection transistor GST.

The string selection transistors SST may be connected with string selection lines SSL1 to SSL8. The ground selection transistors GST may be connected with ground selection lines GSL1 to GSL8. The string selection transistors SST may be connected with the bit lines BL1 to BLz, and the ground selection transistors GST may be connected with the common source line CSL.

The first to m-th word lines WL1 to WLm may be connected with the plurality of memory cells MC1 to MCm in a row direction. The first to z-th bit lines BL1 to BLz may be connected with the plurality of memory cells MC1 to MCm in a column direction. First to z-th page buffers PB1 to PBz may be connected with the first to z-th bit lines BL1 to BLz.

The first word line WL1 may be placed above the first to eighth ground selection lines GSL1 to GSL8. The first memory cells MC1 that are placed at the same height from the substrate may be connected with the first word line WL1. The m-th word line WLm may be located below the first to eighth string selection lines SSL1 to SSL8. The m-th memory cells MCm located at the same height from the substrate may be connected to the m-th word line WLm. In a similar manner, the second to (m−1)-th memory cells MC2 to MCm−1 that are placed at the same heights from the substrate may be respectively connected with the second to (m−1)-th word lines WL2 to WLm−1, respectively.

Figure 4:
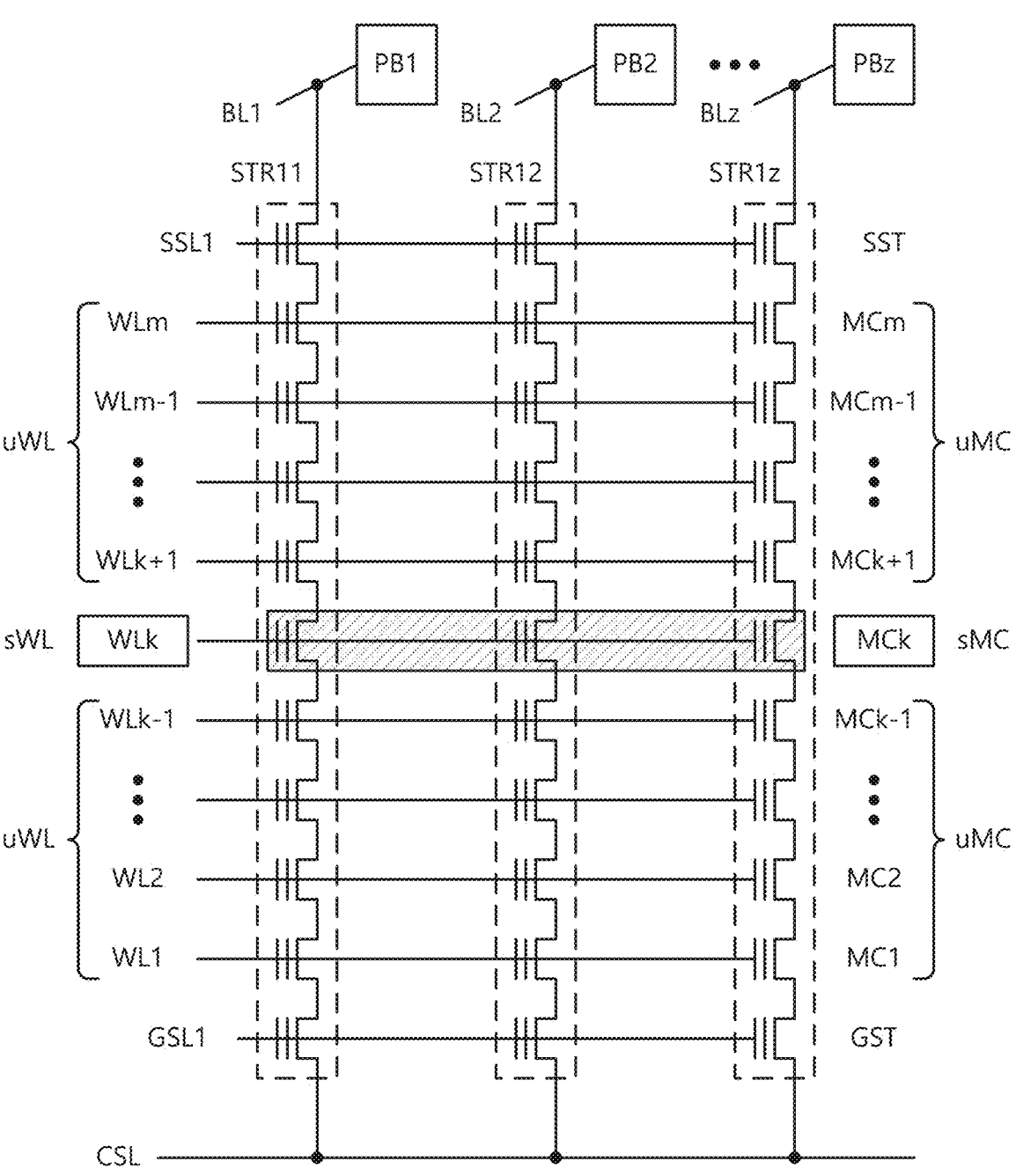
FIG. 4 is a circuit diagram illustrating cell strings selected by a first string selection line SSL1 from among the cell strings of the memory block BLK1 illustrated in FIG. 3.

FIG. 4 is a circuit diagram illustrating cell strings selected by the first string selection line SSL1 from among the cell strings of the memory block BLK1 illustrated in FIG. 3. The 11th to 1z cell strings STR11 to STR1z may be selected by the first string selection line SSL1. The eleventh to 1z cell strings STR11 to STR1z may be connected to the first to z-th bit lines BL1 to BLz, respectively. The first to z-th page buffers PB1 to PBz may be connected to the first to z-th bit lines BL1 to BLz, respectively.

The eleventh cell string STR11 may be connected to the first bit line BL1 and the common source line CSL. The eleventh cell string STR11 may include string selection transistors SST selected by the first string selection line SSL1, first to m-th memory cells MC1 to MCm connected to the first to m-th word lines WL1 to WLm, and ground selection transistors GST selected by the first ground selection line GSL1. The twelfth cell string STR12 may be connected to the second bit line BL2 and the common source line CSL. The 1z cell string STR1z may be connected to the z-th bit line BLz and the common source line CSL.

The first word line WL1 and the m-th word line WLm may be edge word lines (edge WL). The second word line WL2 and the (m−1)-th word line WLm−1 may be edge adjacent word lines. The k-th word line WLk may be a selected word line sWL. The (k−1)-th word line WLk−1 and the (k+1)-th word line WLk+1 may be adjacent word lines adjacent to the selected word line. If the k-th word line WLk is the selected word line sWL, the remaining word lines WL1 to WLk−1 and WLk+1 to WLm may be unselected word lines uWL.

The first memory cells MC1 and the m-th memory cells MCm may be edge memory cells. The second memory cells MC2 and the (m−1)-th memory cells MCm−1 may be edge adjacent memory cells. The k-th memory cells MCk may be selected memory cells sMC. The (k−1)-th memory cells MCk−1 and the (k+1)-th memory cells MCk+1 may be memory cells adjacent to the selected memory cells (adjacent MC). If the k-th memory cells MCK are selected memory cells sMC, the remaining memory cells MC1 to MCk−1 and MCk+1 to MCm may be unselected memory cells uMC.

A set of memory cells selected by one string selection line and connected to one word line may be one page. For example, memory cells selected by the first string selection line SSL1 and connected to the k-th word line WLk may be one page. For example, eight pages may be configured on the k-th word line WLk. Among the eight pages, a page connected to the first string selection line SSL1 is a selected page, and pages connected to the second to eighth string selection lines SSL2 to SSL8 are unselected pages.

Figure 5:
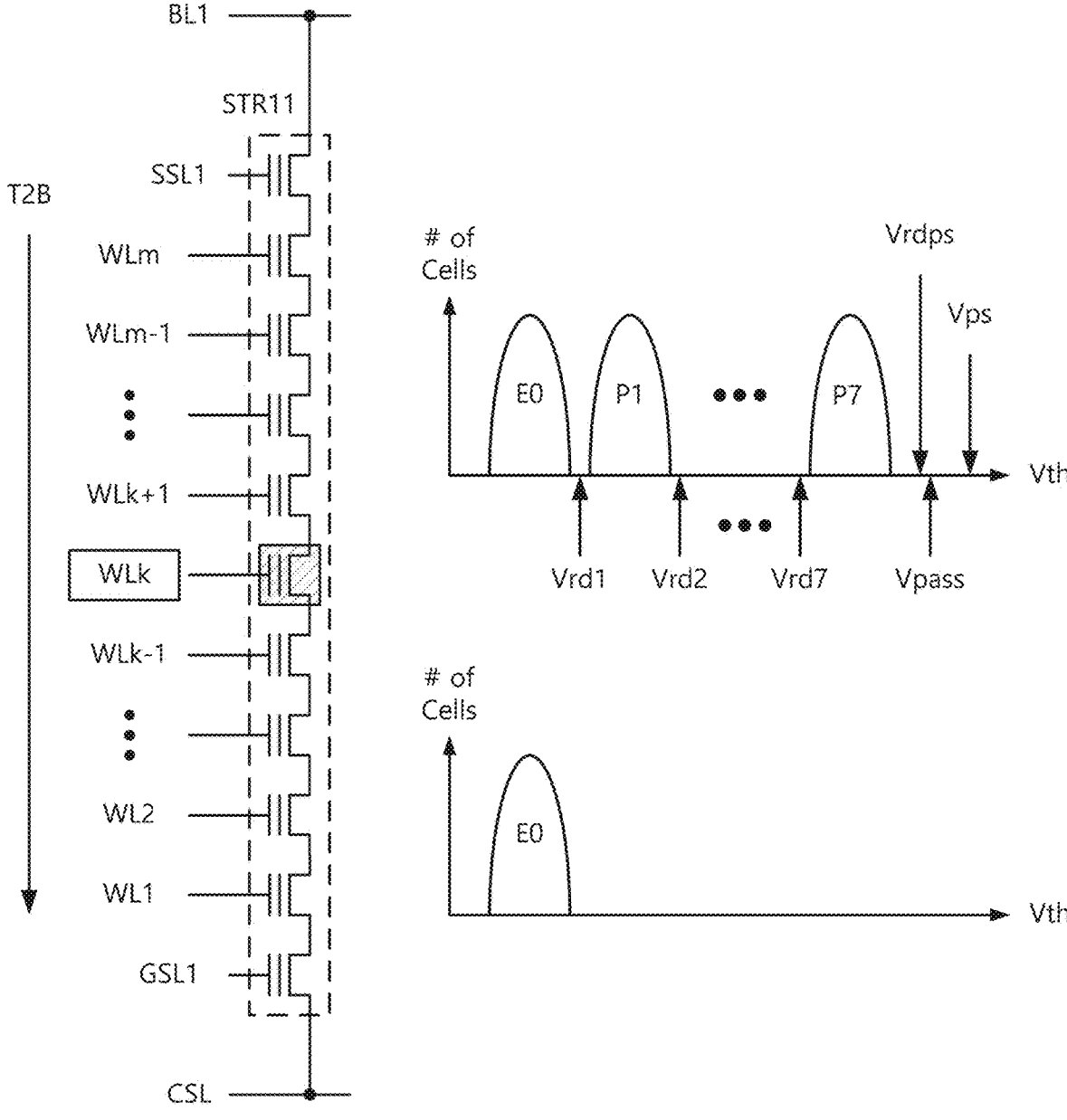
FIG. 5 is a diagram illustrating an example embodiment of threshold voltage distributions of memory cells illustrated in FIG. 4.

FIG. 5 is a diagram illustrating an example embodiment of threshold voltage distributions of memory cells illustrated in FIG. 4. The horizontal axis represents the threshold voltage Vth, and the vertical axis represents the number of memory cells.

FIG. 5 shows an example in which 3-bit data is stored in one memory cell. A 3-bit memory cell may have one of eight states (E0, P1 to P7) according to the threshold voltage distribution. E0 represents an erase state, and P1 to P7 represent program states.

During a read operation, the selection read voltages Vrd1 to Vrd7 may be provided to the selected word line sWL, and the pass voltage Vps and/or the read pass voltage Vrdps may be provided to the unselected word lines uWL. The pass voltage Vps and/or the read pass voltage Vrdps may be a voltage sufficient to turn on the memory cells. For example, the pass voltage Vps may be provided to the adjacent word lines WLk±1, and the read pass voltage Vrdps may be provided to the unselected word lines other than the adjacent word lines.

The first selection read voltage Vrd1 may be a voltage level between the erase state E0 and the first program state P1. The second selection read voltage Vrd2 may be a voltage level between the first and second program states P1 and P2. In this way, the seventh selection read voltage Vrd7 may be a voltage level between the sixth and seventh program states P6 and P7.

When the first selection read voltage Vrd1 is applied, the memory cell in the erase state E0 may be an on cell and the memory cell in the first to seventh program states P1 to P7 may be an off cell. When the second selection read voltage Vrd2 is applied, the memory cell in the erase state E0 and the first program state P1 may an on cell, and the memory cell in the second to seventh program states P2 to P7 may an off cell. In this way, when the seventh selection read voltage Vrd7 is applied, the memory cell in the erase state E0 and the first to sixth program states P1 to P6 may be an on cell and the memory cell in the seventh program state P7 may be an off cell.

During a read operation, the k-th word line WLk may be selected. A power voltage may be applied to the string selection line SSL1 and the ground selection line GSL1, and the string select transistor SST and the ground select transistor GST may be turned on. Also, the selection read voltage Vrd may be provided to the selected word line sWL, and the read pass voltage Vrdps and/or the pass voltage Vps may be provided to the unselected word lines uWL.

When the read operation of the k-th word line WLk is repeatedly performed, the high voltage read pass voltage Vrdps may be repeatedly provided to the remaining word lines. At this time, a read disturbance may occur in the remaining word lines, and thus the threshold voltage may be distorted. Memory cells connected to the k-th word line WLk may be off cells when a selection read voltage is provided. That is, when the threshold voltage of the k-th memory cell is higher than the selection read voltage, the k-th memory cell may be an off cell. When the k-th memory cell is an off cell, a channel may be separated at the k-th memory cell. That is, a lower channel of the k-th memory cell may receive a ground voltage from the common source line CSL, and an upper channel of the k-th memory cell may have a negative channel voltage Vneg.

A channel voltage difference may occur between a lower channel and an upper channel with the k-th memory cell interposed therebetween. Due to the channel voltage difference, hot carrier injection (HCI) may occur in an adjacent memory cells MCk+1 and/or MCk−1. For this reason, threshold voltages of memory cells connected to adjacent word lines WLk+1 and/or WLk−1 may be distorted. For example, the threshold voltages of memory cells in the erased state E0 may rise to enter the programmed state.

Figure 6:
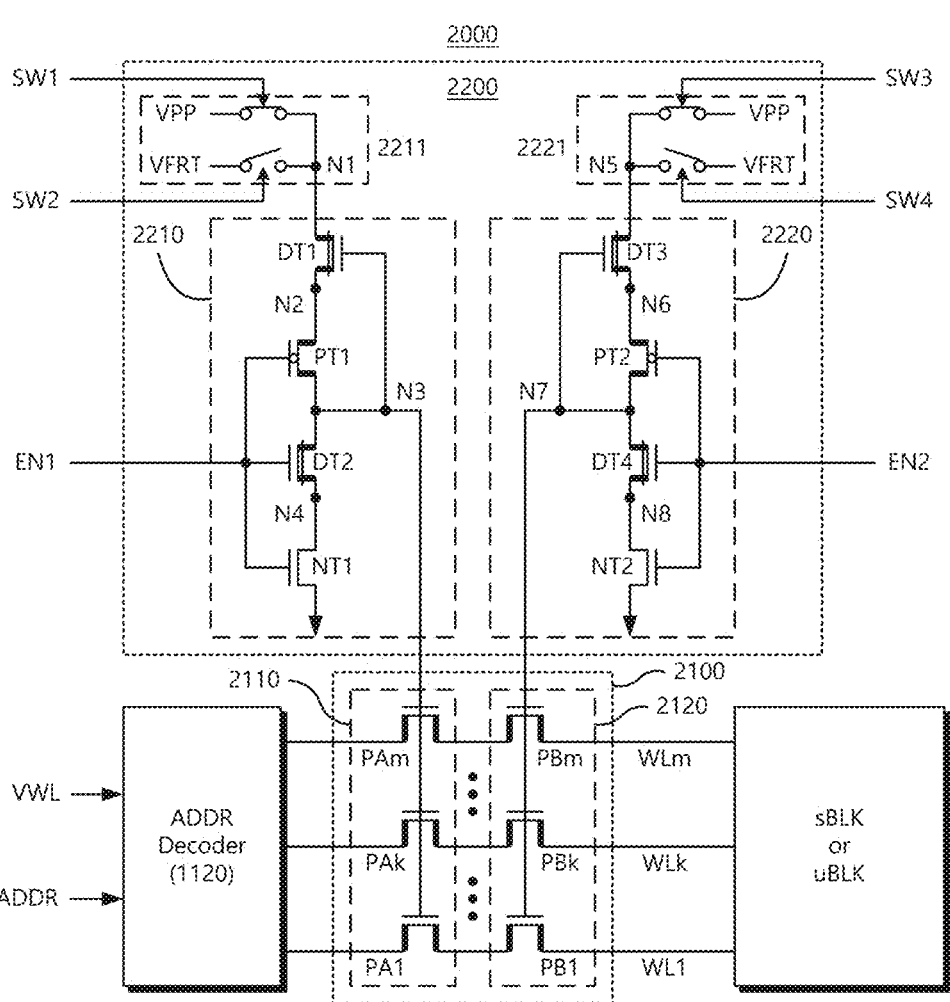
FIG. 6 is a circuit diagram illustrating an example embodiment of a block selection circuit shown in FIG. 2.

FIG. 6 is a circuit diagram illustrating an example embodiment of a block selection circuit shown in FIG. 2. Referring to FIGS. 2 and 6, the block selection circuit 2000 may provide a read voltage, program voltage, or erase voltage to a selected memory block sBLK among a plurality of memory blocks (BLK1 to BLKn). The block selection circuit 2000 may include a pass transistor circuit 2100 and a pass transistor driver 2200.

The pass transistor circuit 2100 may include a first pass transistor circuit 2110 and a second pass transistor circuit 2120. The first pass transistor circuit 2110 may include first pass transistors (PA1 to PAm). The second pass transistor circuit 2120 may include second pass transistors (PB1 to PBm). The first and second pass transistors may be high-voltage NMOS transistors that are resistant to high voltages such as the program voltage Vpgm or the erase voltage Vers.

The pass transistor circuit 2100 may be connected between the address decoder 1120 and the memory block (sBLK or uBLK). For example, two pass transistors PA1 and PB1 may be connected in series between the address decoder 1120 and the first word line WL1. Two pass transistors (PAK, PBk) may be connected in series between the address decoder 1120 and the k-th word line (WLk). Two pass transistors (PAm, PBm) may be connected in series between the address decoder 1120 and the m-th word line (WLk).

The pass transistor driver 2200 may provide gate voltages to the first pass transistors (PA1 to PAm) and the second pass transistors (PB1 to PBm) of the pass transistor circuit 2100. The pass transistor driver 2200 may include a first driver circuit 2210, a first switch circuit 2211, a second driver circuit 2220, and a second switch circuit 2221.

The first driver circuit 2210 may include first and second depletion transistors DT1 and DT2, a first P-channel metal-oxide semiconductor (PMOS) transistor PT1, and a first N-channel metal-oxide semiconductor (NMOS) transistor NT1. The first depletion transistor DT1 may be connected between the first node N1 and the second node N2, and may be turned on or off depending on the voltage level of the third node N3. The second depletion transistor DT2 may be connected between the third node N3 and the fourth node N4, and may be turned on or off according to the first enable signal EN1. The first enable signal EN1 may be provided from the control logic 1160. The first and second depletion transistors DT1 and DT2 may be high-voltage depletion transistors that are durable against high voltage.

The first driver circuit 2210 may operate as an inverter including the first PMOS transistor PT1 and the first NMOS transistor NT1. The first PMOS transistor PT1 may be connected between the second node N2 and the third node N3 and may be turned on or off according to the first enable signal EN1. The first PMOS transistor PT1 may be a high-voltage PMOS transistor that is durable against high voltage. The first NMOS transistor NT1 may be connected between the fourth node N4 and the ground terminal, and may be turned on or off according to the first enable signal EN1.

The first switch circuit 2211 may receive first and second switch signals (SW1, SW2) from the control logic 1160. The first switch circuit 2211 may supply a first power voltage VPP or a second power voltage VFRT to the first node N1. The first switch circuit 2211 may provide the first power voltage VPP when the first switch signal SW1 is ON input. And the first switch circuit 2211 may provide the second power voltage VFRT when the second switch signal SW2 is ON. The first power voltage VPP may be higher than the second power voltage VFRT.

The first driver circuit 2210 may provide the first power voltage VPP or the second power voltage VFRT to the first pass transistor circuit 2110 according to the control of the first enable signal EN1 and/or the first switch circuit 2211. In an embodiment, when the first enable signal EN1 is at a low level, the first driver circuit 2210 may provide the first power voltage VPP when the first switch signal SW1 is ON input. The first driver circuit 2210 may provide the second power voltage VRFT when the second switch signal SW2 is ON.

The second driver circuit 2220 may include third and fourth depletion transistors (DT3, DT4), a second PMOS transistor PT2, and a second NMOS transistor NT2. The third depletion transistor DT3 may be connected between a fifth node N5 and a sixth node N6, and may be turned on or off depending on the voltage level of a seventh node N7. The fourth depletion transistor DT4 may be connected between the seventh node N7 and a eighth node N8, and may be turned on or off according to a second enable signal EN2. The second enable signal EN2 may be provided from the control logic 1160. The third and fourth depletion transistors DT3 and DT4 may be high-voltage depletion transistors that are durable against high voltage.

The second driver circuit 2220 may operate as an inverter including the second PMOS transistor PT2 and the second NMOS transistor NT2. The second PMOS transistor PT2 may be connected between the sixth node N6 and the seventh node N7 and may be turned on or off according to the second enable signal EN2. The second PMOS transistor PT2 may be a high-voltage PMOS transistor that is durable against high voltage. The second NMOS transistor NT2 may be connected between the eighth node N8 and the ground terminal, and may be turned on or off according to the second enable signal EN2.

The second switch circuit 2221 may receive third and fourth switch signals (SW3, SW4) from the control logic 1160. The second switch circuit 2221 may supply a first power voltage VPP or a second power voltage VFRT to a fifth node N5. The second switch circuit 2221 may provide the first power voltage VPP when the third switch signal SW3 is ON. And the second switch circuit 2221 may provide the second power voltage VFRT when the fourth switch signal SW4 is ON.

The second driver circuit 2220 may provide the first power voltage VPP or the second power voltage VFRT to the second pass transistor circuit 2120 according to the control of the second enable signal EN2 and/or the second switch circuit 2221. In an embodiment, when the second enable signal EN2 is at a low level, the second driver circuit 2220 may provide the first power voltage VPP when the third switch signal SW3 is ON. The second driver circuit 2220 may provide the second power voltage VRFT when the fourth switch signal SW4 is ON.

Figure 7:
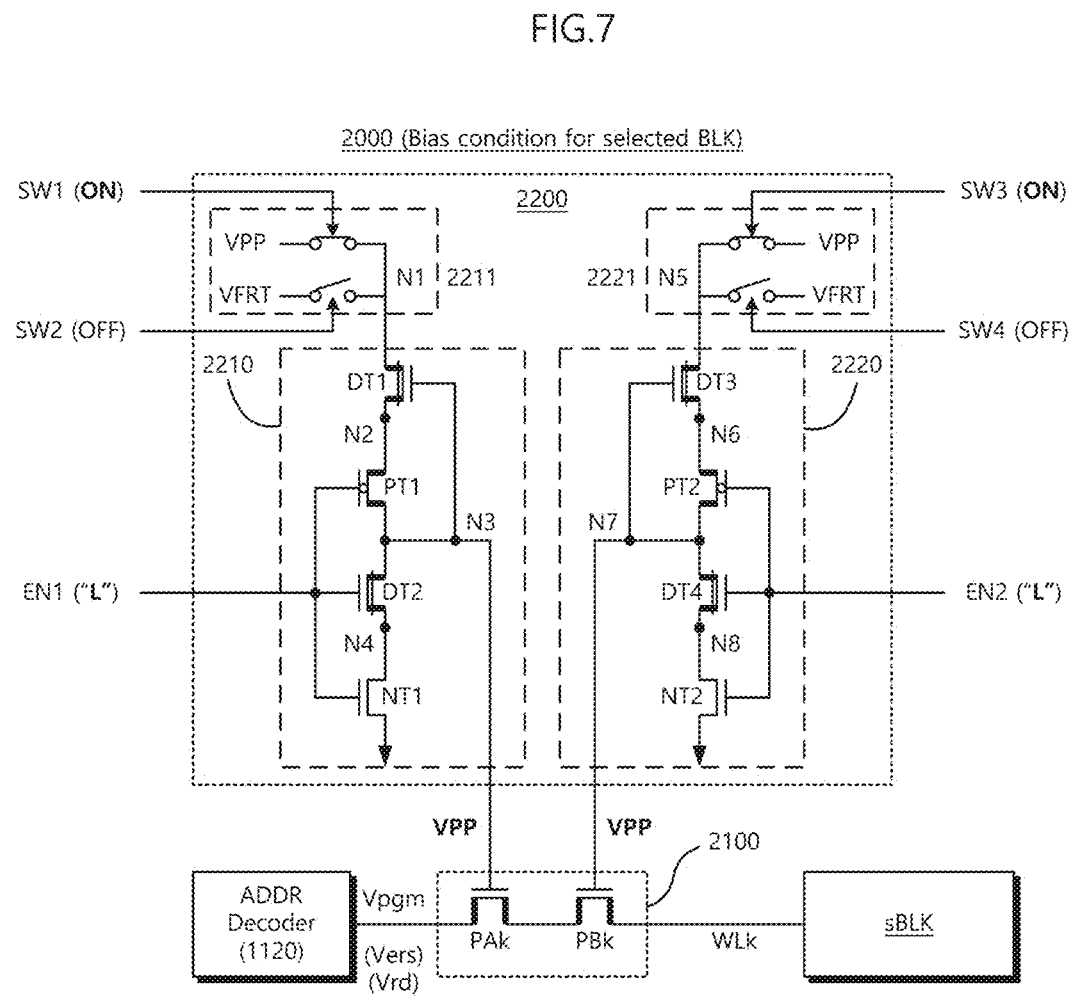

FIGS. 7 and 8 are a circuit diagram and a table, respectively, illustrating bias conditions of the block selection circuit shown in FIG. 6. Referring to FIGS. 7 and 8, the first power voltage VPP may be provided to the gates of the first and second pass transistors PAK and PBk of the selected memory block sBLK during a read, program, or erase operation.

During a read, program, or erase operation, the first switch signal SW1 of the first switch circuit 2211 may be ON and the second switch signal SW2 may be OFF. The third switch signal SW3 of the second switch circuit 2221 may be ON and the fourth switch signal SW4 may be OFF. The first enable signal EN1 of the first driver circuit 2210 may be at a low level (L). The second enable signal EN2 of the second driver circuit 2220 may be at a low level (L).

Under these bias conditions, the first and second PMOS transistors (PT1, PT2) may be turned on, and the first and second NMOS transistors (NT1, NT2) may be turned off. Third and seventh nodes (N3, N7) may have a voltage level of the first power voltage VPP. At this time, the selection read voltage Vrd, program voltage Vpgm, or erase voltage Vers may be provided to the selected selection word line sWL (e.g., WLk). And a read pass voltage Vrdps, a pass voltage Vpass, or an erase voltage Vers may be provided to the unselected word lines uWL.

FIGS. 9 to 12 are circuit diagrams illustrating bias conditions for the unselected memory block shown in FIG. 6. FIG. 13 is a table illustrating bias conditions for the unselected memory block.

Figure 9:
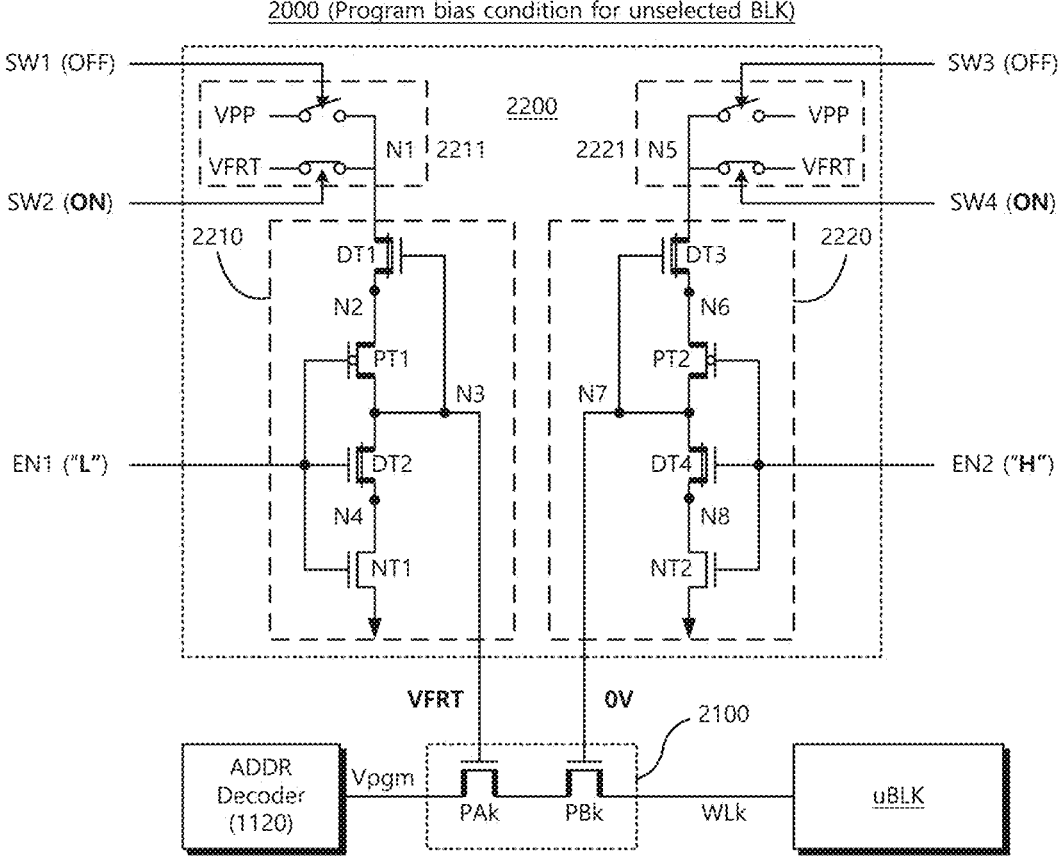
FIGS. 9 to 12 are circuit diagrams illustrating bias conditions for the unselected memory block shown in FIG. 6.
Figure 11:
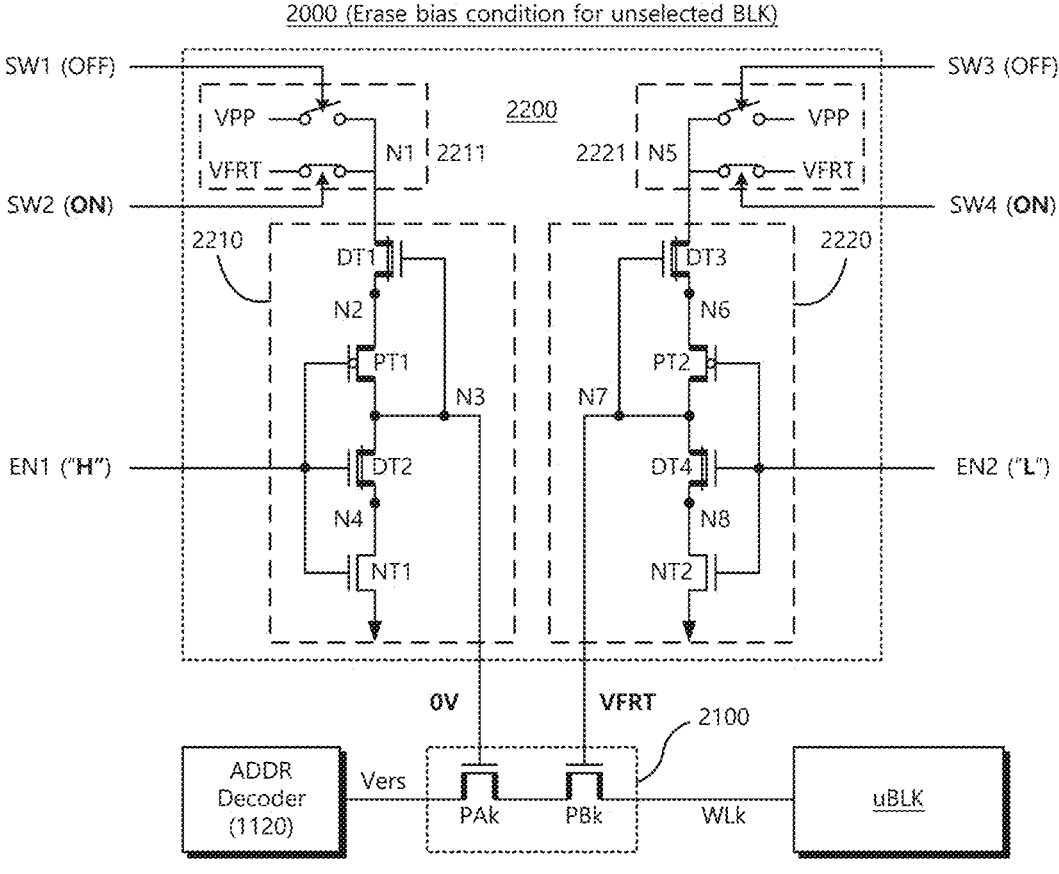

FIG. 9 illustrates an example embodiment in which the second power voltage VFRT is applied to the first pass transistor PAK of the unselected memory block uBLK and 0V is applied to the second pass transistor PBk during a program operation. FIG. 11 illustrates an example embodiment in which 0V is applied to the first pass transistor PAK of the unselected memory block uBLK and the second power voltage VFRT is applied to the second pass transistor PBk during an erase operation.

Referring to FIGS. 9 and 13, during a program operation, the first switch signal SW1 of the first switch circuit 2211 may be OFF and the second switch signal SW2 may be ON. The first enable signal EN1 of the first driver circuit 2210 may be at a low level (L). Under these bias conditions, the first PMOS transistor PT1 may be turned on and the first NMOS transistor NT1 may be turned off. The third node N3 may have a voltage level of the second power voltage VFRT.

The third switch signal SW3 of the second switch circuit 2221 may be OFF and the fourth switch signal SW4 may be ON. The second enable signal EN2 of the second driver circuit 2220 may be at a high level (H). Under these bias conditions, the second PMOS transistor PT2 may be turned off and the second NMOS transistor NT2 may be turned on. The seventh node N7 may have a ground voltage (e.g., 0V).

Figure 10:
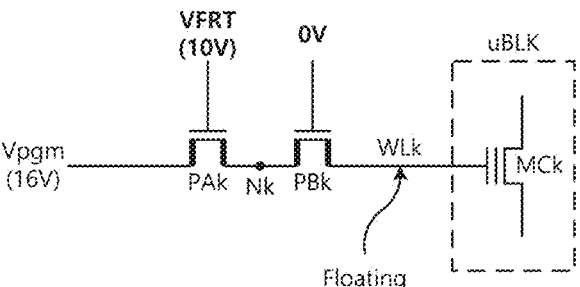

Referring to FIG. 10, a program voltage Vpgm (e.g., 16V) may be applied to a drain of the first pass transistor PAK, and a second power voltage VFRT (e.g., 10V) may be applied to a gate of the first pass transistor PAK. The voltage level of the k-th node Nk may be VFRT-Vtha. Here, Vtha is a threshold voltage of the first pass transistor PAK. When a ground voltage (e.g., 0V) is applied to a gate of the second pass transistor PBk, the k-th word line WLk may be in a floating state. When the k-th word line (WLk; k=1~m) is in a floating state, the unselected memory block uBLK may be program-inhibited.

FIGS. 11 and 13, during an erase operation, the first switch signal SW1 of the first switch circuit 2211 may be OFF and the second switch signal SW2 may be ON. The first enable signal EN1 of the first driver circuit 2210 may be at a high level (H). Under these bias conditions, the first PMOS transistor PT1 may be turned off and the first NMOS transistor NT1 may be turned on. The third node N3 may have a ground voltage (e.g., 0V).

The third switch signal SW3 of the second switch circuit 2221 may be OFF and the fourth switch signal SW4 may be ON. The second enable signal EN2 of the second driver circuit 2220 may be at a low level (L). Under these bias conditions, the second PMOS transistor PT2 may be turned on and the second NMOS transistor NT2 may be turned off. The seventh node N7 may have a voltage level of the second power voltage VFRT.

Figure 12:
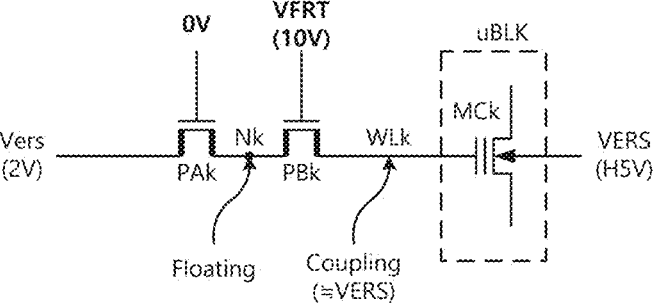

Referring to FIG. 12, an erase voltage Vers (e.g., 2V) may be applied to the drain of the first pass transistor PAK, and a ground voltage (e.g., 0V) may be applied to the gate of the first pass transistor PAK. The k-th node (Nk) may be in a floating state.

In an embodiment, when the second power voltage VFRT (e.g., 10V) is applied to the gate of the second pass transistor PBk, the k-th word line WLk may rise to the body voltage VERS (e.g., 15V) provided to the body of the memory cell due to the coupling effect. When the k-th word line (WLk; k=1~m) is coupled, the unselected memory block uBLK may be erase-inhibited.

When the k-th word line WLk rises to the body voltage due to the coupling effect, a voltage level of the k-th node Nk may be VFRT-Vthb. Here, Vthb is the threshold voltage of the second pass transistor PBk. The first pass transistor PAk only needs to have durability against a voltage level VFRT-Vthb. The block selection circuit 2000 according to example embodiments of the disclosure may reduce the high voltage that each pass transistor must endure during a program or erase operation. Therefore, the block selection circuit 2000 of the disclosure may reduce the size of individual pass transistors.

Figure 14:
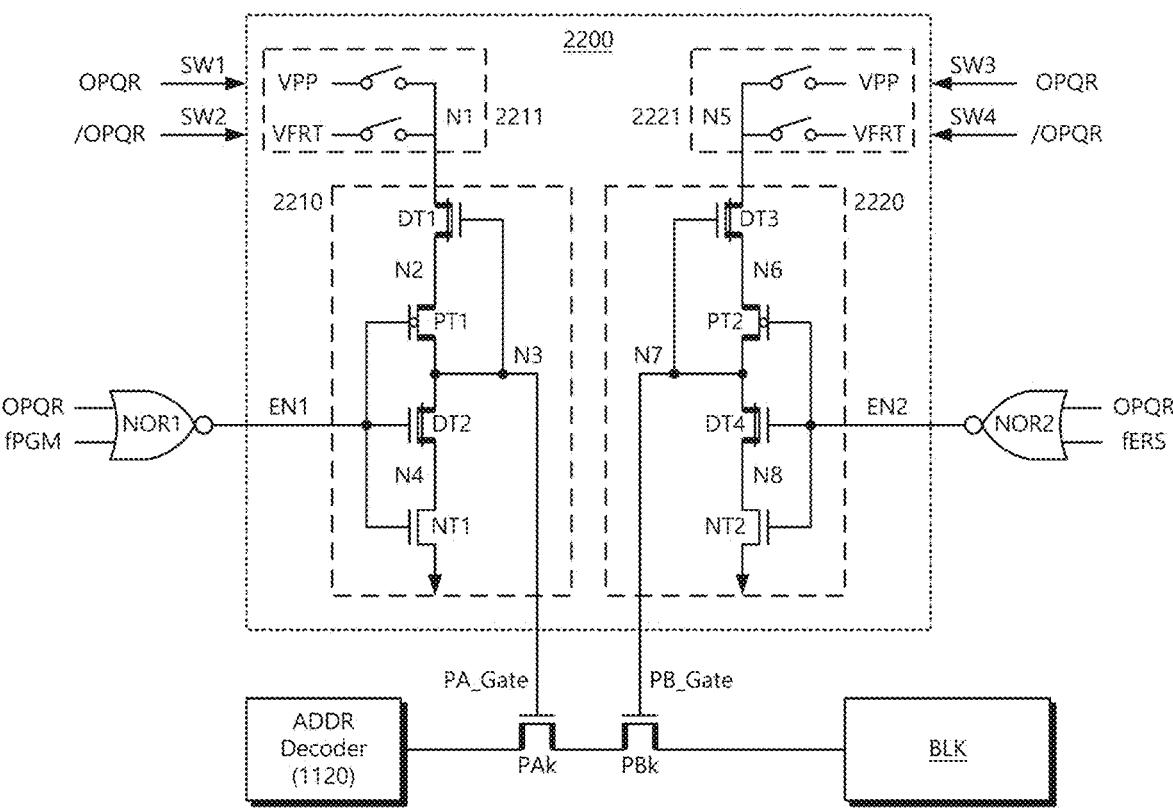

FIGS. 14 to 16 are a circuit diagram and tables, respectively, illustrating example embodiments of a method of generating switch signals and enable signals shown in FIG. 2. Referring to FIGS. 2 and 14, the switch signals SW and the enable signals EN may be provided from the control logic 1160.

The switch signals SW may be generated using the OPQR signal. The OPQR signal may be generated from the block address. The OPQR signal may be at a high level when the block address is for a selected memory block sBLK, and may be at a low level when the block address is for an unselected memory block uBLK. That is, the switch signals SW may be ON if the block address is for the selected memory block sBLK, and may be OFF if the block address is for the unselected memory block uBLK.

For example, when the memory block BLK is the selected memory block sBLK, OPQR is at a high level and the first and third switch signals SW1 and SW3 may be turned on. On the other hand, if the memory block BLK is the unselected memory block uBLK, OPQR is at a low level and the second and fourth switch signals SW2 and SW4 may be turned on.

The first enable signal EN1 may be generated through a logical operation of the OPQR signal and the program operation signal fPGM. For example, the first enable signal EN1 may be generated through NOR operation of the OPQR signal and the fPGM signal. The first NOR gate NOR1 may receive the OPQR signal and the fPGM signal and output the first enable signal EN1.

Referring to FIG. 15, the first NOR gate NOR1 may output a high-level first enable signal EN1 when both the OPQR signal and the fPGM signal are low level. And in other cases, the first NOR gate NOR1 may output a low-level first enable signal EN1.

The second enable signal EN2 may be generated through a logical operation of the OPQR signal and an erase operation signal fERS. For example, the second enable signal EN2 may be generated through NOR operation of the OPQR signal and the fERS signal. The second NOR gate NOR2 may receive the OPQR signal and the fERS signal and output the second enable signal EN2.

Referring to FIG. 15, the second NOR gate NOR2 may output a high-level second enable signal EN2 when both the OPQR signal and the fERS signal are low level. And in other cases, the second NOR gate NOR2 may output a low-level second enable signal EN2.

Referring to FIG. 16, in the case of the selected memory block sBLK, the first power voltage VPP may be provided to the gates PA_Gate and PB_Gate of the first and second pass transistors PAk and PBk. In the case of the unselected memory block uBLK, the second power voltage VFRT may be provided to the gate PA_Gate of the first pass transistor PAK during a program operation. During an erase operation, the second power voltage VFRT may be provided to the gate PB_Gate of the second pass transistor PBk.

Figure 17:
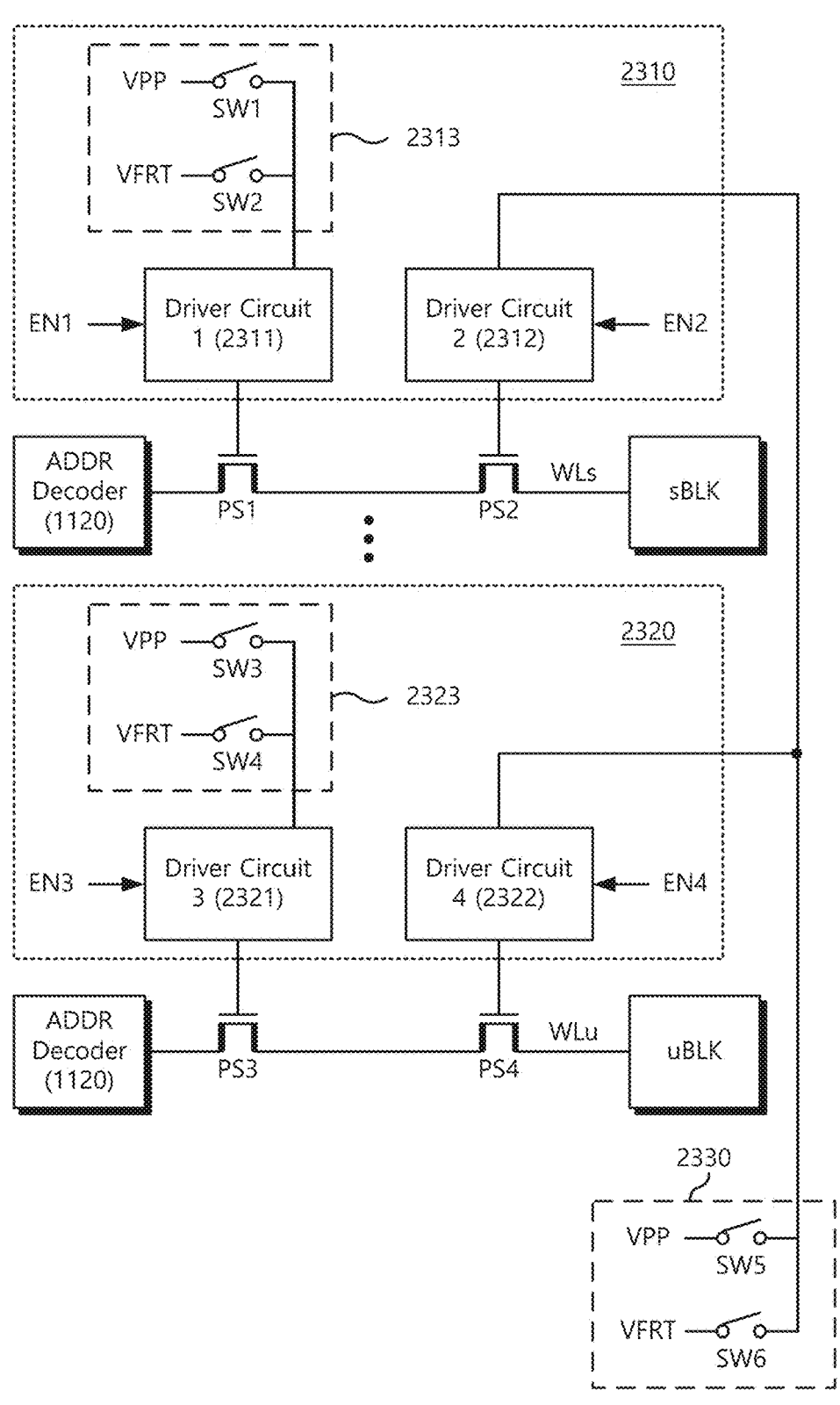
FIG. 17 s a circuit diagram illustrating another embodiment of the block selection circuit shown in FIG. 2.

FIG. 17 s a circuit diagram illustrating another embodiment of the block selection circuit shown in FIG. 2. Referring to FIG. 17 the block selection circuit 2000 may include a selection pass transistor driver 2310, an unselected pass transistor driver 2320, and a shared switch circuit 2330.

The selection pass transistor driver 2310 may provide gate voltages for turning on or off the pass transistors PS1 and PS2 of the selected memory block sBLK. The unselected pass transistor driver 2320 may provide gate voltages for turning on or off the pass transistors PS3 and PS4 of the unselected memory block uBLK. The shared switch circuit 2330 may provide the first power voltage VPP or the second power voltage VFRT to the selection pass transistor driver 2310 and the unselected pass transistor driver 2320.

The selection pass transistor driver 2310 may provide gate voltages to the first and second pass transistors PS1 and PS2. The selection pass transistor driver 2310 may include a first driver circuit 2311 ("Driver Circuit 1 (2311)" in FIG. 17), a selection switch circuit 2313, and a second driver circuit 2312 ("Driver Circuit 2 (2312)" in FIG. 17).

The first driver circuit 2311 may have the same configuration and operating principle as the driver circuit shown in FIG. 6. As shown in FIG. 6, the first driver circuit 2311 may operate as an inverter including the first PMOS transistor PT1 and the first NMOS transistor NT1. The first driver circuit 2311 may provide a power voltage or a ground voltage to the first pass transistor PS1 according to the first enable signal EN1.

The first driver circuit 2311 may provide the first power voltage VPP or the second power voltage VFRT to the first pass transistor PS1 according to the control of the first enable signal EN1 and/or the selection switch circuit 2313. If the first enable signal EN1 is at a high level, the first driver circuit 2311 may provide a ground voltage. If the first enable signal EN1 is at a low level, the first driver circuit 2311 may provide the first power voltage VPP when the first switch signal SW1 is input. The first driver circuit 2311 may provide the second power voltage VFRT when the second switch signal SW2 is input.

The selection switch circuit 2313 may receive the first and second switch signals (SW1, SW2) from the control logic 1160, and may provide the first power voltage VPP or the second power voltage VFRT to the first driver circuit 2311. The selection switch circuit 2313 may provide a first power voltage VPP when the first switch signal SW1 is input, and may provide a second power voltage VFRT when the second switch signal SW2 is input.

The second driver circuit 2312 may provide the power voltage or ground voltage to the second pass transistor PS2 according to the second enable signal EN2. The second driver circuit 2312 may provide the first power voltage VPP or the second power voltage VFRT to the second pass transistor PS2 according to the control of the second enable signal EN2. When the second enable signal EN2 is at a high level, the second driver circuit 2312 may provide a ground voltage. When the second enable signal EN2 is at a low level, the second driver circuit 2312 may provide the first power voltage VPP or the second power voltage VRFT under the control of the shared switch circuit 2330.

The unselected pass transistor driver 2320 may provide gate voltages to the third and fourth pass transistors PS3 and PS4. The unselected pass transistor driver 2320 may include a third driver circuit 2321 ("Driver Circuit 3 (2321)" in FIG. 17), an unselected switch circuit 2323, and a fourth driver circuit 2322 ("Driver Circuit 4 (2322)" in FIG. 17).

The third driver circuit 2321 may provide the power voltage or ground voltage to the third pass transistor PS3 according to the third enable signal EN3. The third driver circuit 2321 may provide the first power voltage VPP or the second power voltage VFRT to the third pass transistor PS3 according to the control of the third enable signal EN3 and/or the unselected switch circuit 2323. If the third enable signal EN3 is at a high level, the third driver circuit 2321 may provide a ground voltage. If the third enable signal EN3 is at a low level, the third driver circuit 2321 may provide the first power voltage VPP when the third switch signal SW3 is input. And the third driver circuit 2321 may provide the second power voltage VFRT when the fourth switch signal SW4 is input.

The unselected switch circuit 2323 may receive the third and fourth switch signals SW3 and SW4 from the control logic 1160, and may apply the first power voltage VPP or the second power voltage VFRT to the third driver circuit 2321. The unselected switch circuit 2323 may provide the first power voltage VPP when the third switch signal SW3 is input. The unselected switch circuit 2323 may provide the second power voltage VFRT when the fourth switch signal SW4 is input.

The fourth driver circuit 2322 may provide the power voltage or ground voltage to the fourth pass transistor PS4 according to the fourth enable signal EN4. The fourth driver circuit 2322 may provide the first power voltage VPP or the second power voltage VFRT to the fourth pass transistor PS4 according to the control of the fourth enable signal EN4. When the fourth enable signal EN4 is at a high level, the fourth driver circuit 2322 may provide a ground voltage. When the fourth enable signal EN4 is at a low level, the fourth driver circuit 2322 may provide the first power voltage VPP or the second power voltage VRFT under the control of the shared switch circuit 2330.

The shared switch circuit 2330 may receive fifth and sixth switch signals (SW5, SW6) from the control logic 1160, and may provide the first power voltage VPP or the second power voltage VFRT to the second and fourth driver circuits (2312, 2322). The shared switch circuit 2330 may provide a first power voltage VPP when the fifth switch signal SW5 is input, and may provide a second power voltage VFRT when the sixth switch signal (SW6) is input.

The block selection circuit 2000 shown in FIG. 17 may control driver circuits (e.g., 2312 and 2322) of the selected memory block sBLK and the unselected memory block uBLK using the shared switch circuit 2330. Therefore, since the block selection circuit 2000 shown in FIG. 17 commonly may use the shared switch circuit 2330, the area may be reduced compared to using an individual switch circuit. As the number of memory blocks increases, the effect of reducing the area of the block selection circuit 2000 may be greater.

Figure 18:
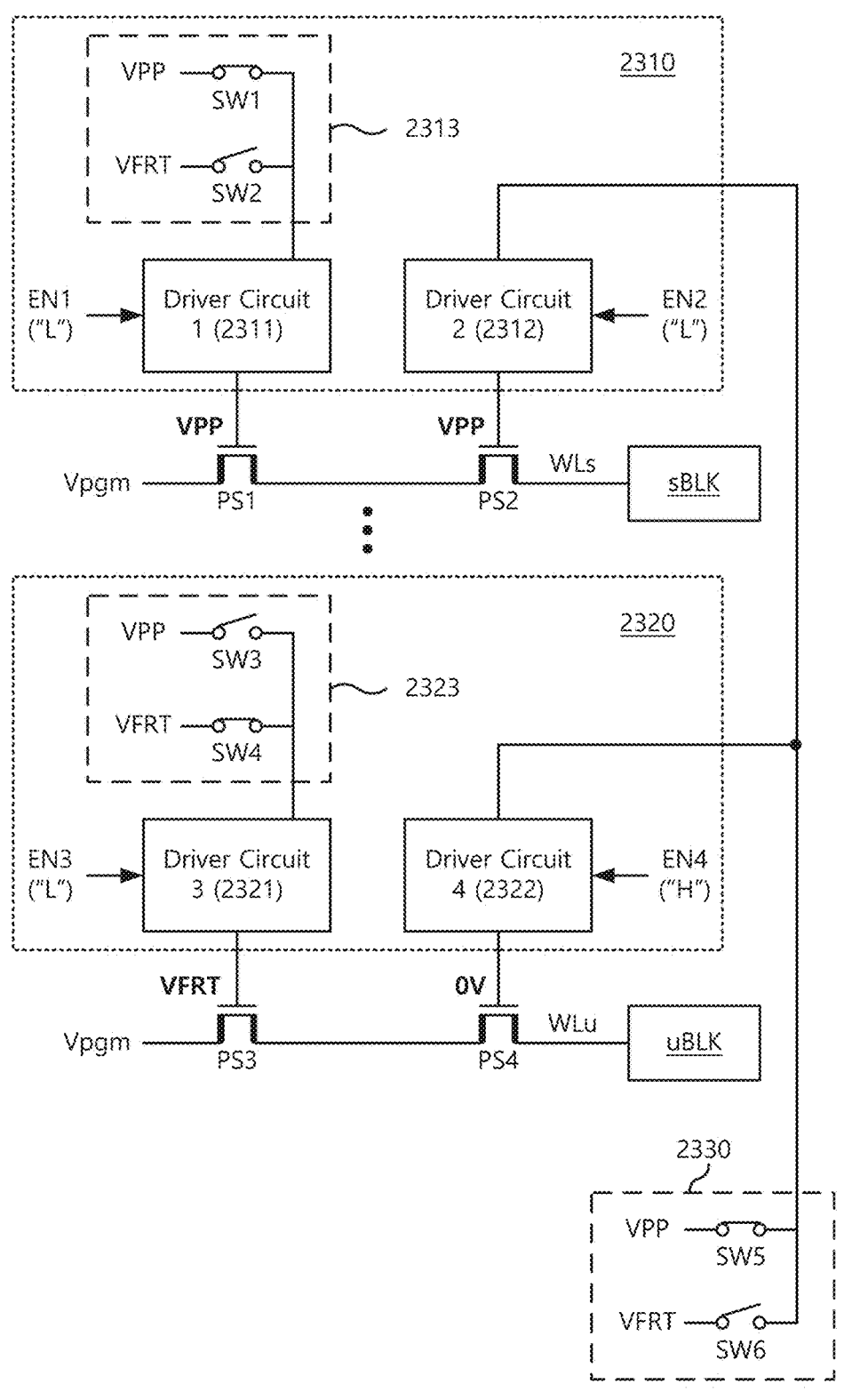
FIGS. 18 and 19 are circuit diagrams illustrating bias conditions during program and erase operations of the block selection circuit shown in FIG. 17.
Figure 19:
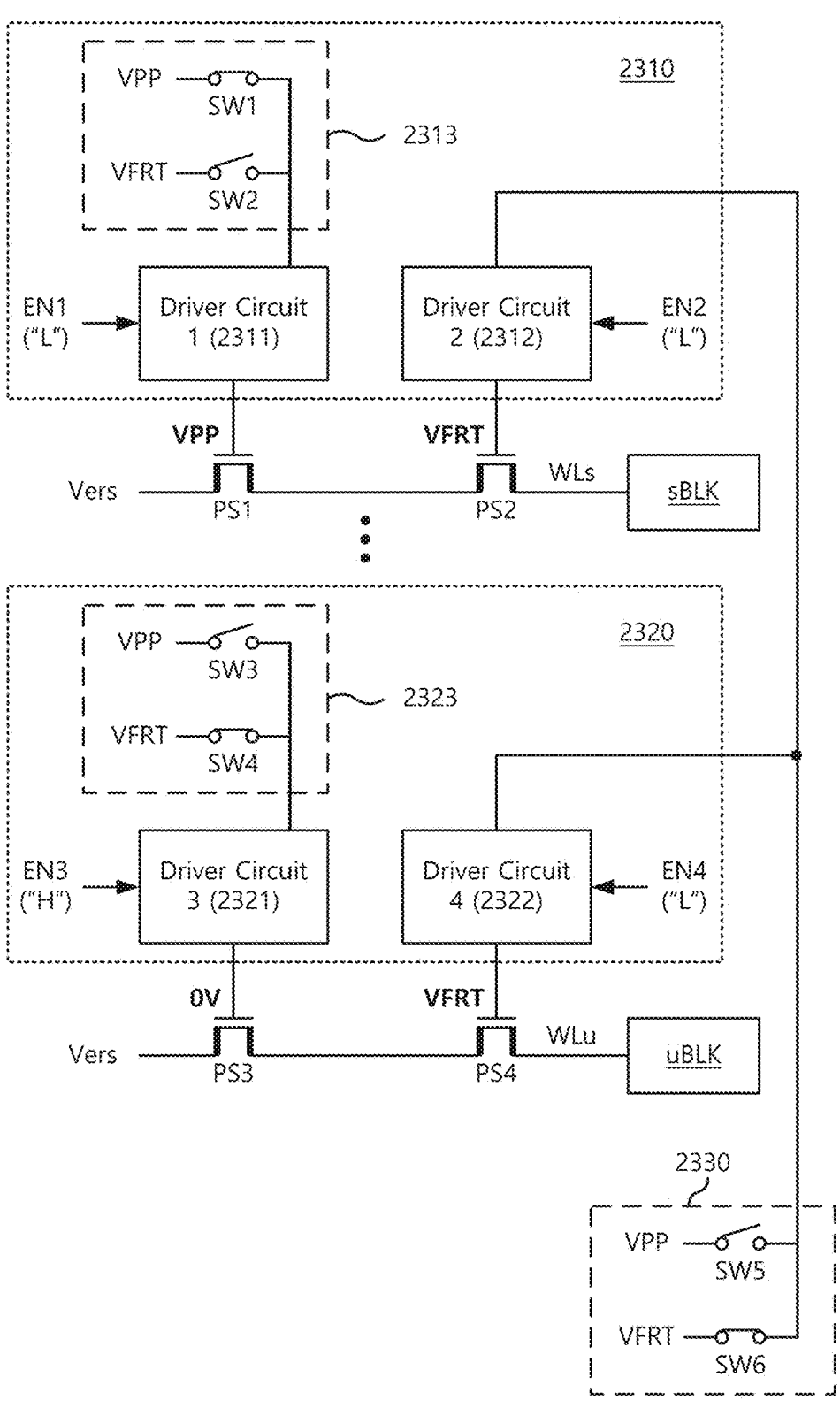

FIGS. 18 and 19 are circuit diagrams illustrating bias conditions during program and erase operations of the block selection circuit shown in FIG. 17. FIG. 18 illustrates bias conditions during the program operation, and FIG. 19 illustrates bias conditions during the erase operation.

Referring to FIG. 18, during a program operation, the first switch signal SW1 of the selection switch circuit 2313 may be ON and the second switch signal SW2 may be OFF. The fifth switch signal SW5 of the shared switch circuit 2330 may be ON, and the sixth switch signal SW6 may be OFF. The first enable signal EN1 of the first driver circuit 2311 may be at a low level (L). The second enable signal EN2 of the second driver circuit 2312 may be at a low level (L).

Under these bias conditions, the first driver circuit 2311 may provide the first power voltage VPP to the first pass transistor PS1. The second driver circuit 2312 may also provide the first power voltage VPP to the second pass transistor PS2. At this time, the program voltage Vpgm may be provided to the word line WLs of the selected memory block sBLK. The pass voltage Vpass may be provided to the remaining word lines of the selected memory block sBLK.

During a program operation, the third switch signal SW3 of the unselected switch circuit 2323 may be OFF and the fourth switch signal SW4 may be ON. The fifth switch signal SW5 of the shared switch circuit 2330 may be ON, and the sixth switch signal SW6 may be OFF. The third enable signal EN3 of the third driver circuit 2321 may be at a low level (L). The fourth enable signal EN4 of the fourth driver circuit 2322 may be at a high level (H).

Under these bias conditions, the third driver circuit 2321 may provide the second power voltage VFRT to the third pass transistor PS3. The fourth driver circuit 2322 may also provide a ground voltage (e.g., 0V) to the fourth pass transistor PS4. The program voltage Vpgm or the pass voltage Vpass may be applied to the drain of the third pass transistor PS3. The second power voltage VFRT may be applied to the gate of the third pass transistor PS3. When the ground voltage (e.g., 0V) is applied to the gate of the fourth pass transistor PS4, the u-th word line WLu may be in a floating state. When the u-th word line (WLu; u=1~m) is in a floating state, the unselected memory block uBLK may be program-inhibited.

Referring to FIG. 19, during an erase operation, the first switch signal SW1 of the selection switch circuit 2313 may be ON and the second switch signal SW2 may be OFF. The fifth switch signal SW5 of the shared switch circuit 2330 may be OFF, and the sixth switch signal SW6 may be ON. The first enable signal EN1 of the first driver circuit 2311 may be at a low level (L). The second enable signal EN2 of the second driver circuit 2312 may be at a low level (L).

Under these bias conditions, the first driver circuit 2311 may provide the first power voltage VPP to the first pass transistor PS1. The second driver circuit 2312 may provide the second power voltage VFRT to the second pass transistor PS2. At this time, the erase voltage Vers may be provided to the word line WLs of the selected memory block sBLK. The body voltage (VERS, see FIG. 12) may be provided to the bodies of memory cells of the selected memory block sBLK.

During an erase operation, the third switch signal SW3 of the unselected switch circuit 2323 may be OFF and the fourth switch signal SW4 may be ON. The fifth switch signal SW5 of the shared switch circuit 2330 may be OFF, and the sixth switch signal SW6 may be ON. The third enable signal EN3 of the third driver circuit 2321 may be at a high level (H). The fourth enable signal EN4 of the fourth driver circuit 2322 may be at a low level (L).

Under these bias conditions, the third driver circuit 2321 may provide a ground voltage (e.g., 0V) to the third pass transistor PS3. The fourth driver circuit 2322 may provide the second power voltage VFRT to the fourth pass transistor PS4. The erase voltage Vers may be applied to the drain of the third pass transistor PS3, and a ground voltage (e.g., 0V) may be applied to the gate the third pass transistor PS3.

When the second power voltage VFRT is applied to the gate of the fourth pass transistor PS4, the u-th word line WLu rises to the body voltage VERS provided to the body of the memory cell due to a coupling effect. When the u-th word line WLu is coupled, the unselected memory block uBLK may be erase-inhibited.

Figure 20:
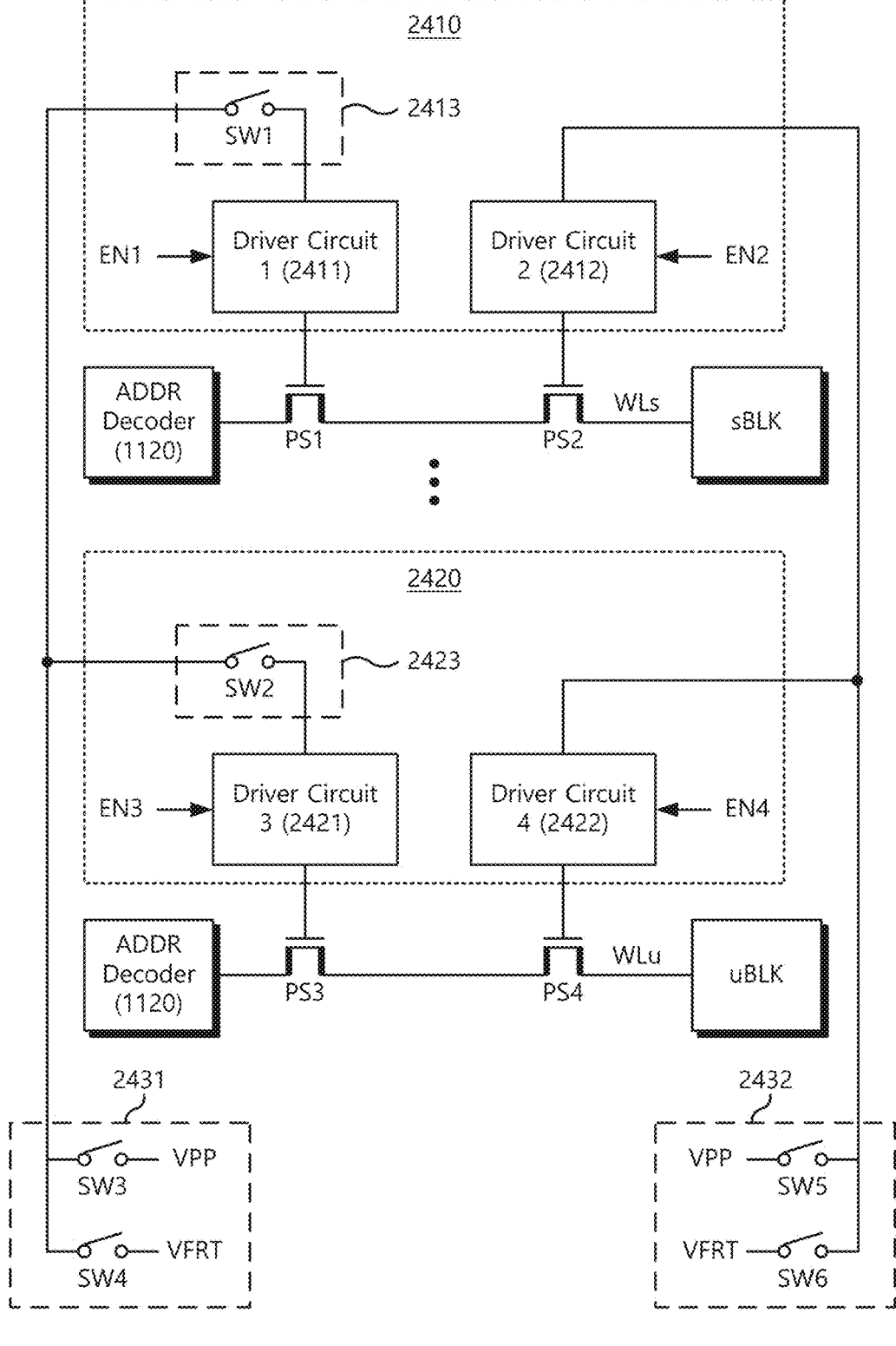
FIG. 20 is a circuit diagram illustrating another example embodiment of the block selection circuit shown in FIG. 2.

FIG. 20 is a circuit diagram illustrating another example embodiment of the block selection circuit shown in FIG. 2. Referring to FIG. 20, the block selection circuit 2000 may include a selected pass transistor driver 2410, an unselected pass transistor driver 2420, a first shared switch circuit 2431, and a second shared switch circuit 2432.

The selected pass transistor driver 2410 may include pass transistors (PS1, PS2) connected to the selected memory block sBLK. A gate voltage may be provided to turn on or off. The unselected pass transistor driver 2420 may provide a gate voltage for turning on or off the pass transistors (PS3, PS4) connected to the unselected memory block uBLK. The first and second shared switch circuits 2431 and 2432 may provide the first power voltage VPP or the second power voltage VFRT to the selected pass transistor driver 2410 and the unselected pass transistor driver 2420.

The selected pass transistor driver 2410 may provide gate voltage to the first and second pass transistors (PS1, PS2). The selected pass transistor driver 2410 may include a first driver circuit 2411 ("Driver Circuit 1 (2411)"), a second driver circuit 2412 ("Driver Circuit 2 (2412)"), and a selected switch circuit 2413.

The first driver circuit 2411 may provide the first power voltage VPP or the second power voltage VFRT to the first pass transistor PS1 under the control of the first enable signal EN1 and/or the selected switch circuit 2413. When the first enable signal EN1 is at a high level, the first driver circuit 2411 may provide a ground voltage. When the first enable signal EN1 is at a low level and the first switch signal SW1 is input, the first driver circuit 2411 may provide the first power voltage VPP or the second power voltage VRFT under the control of the first shared switch circuit 2431.

The second driver circuit 2412 may provide the power voltage or ground voltage to the second pass transistor PS2 according to the second enable signal EN2. When the second enable signal EN2 is at a high level, the second driver circuit 2412 may provide a ground voltage to the second pass transistor PS2. When the second enable signal EN2 is at a low level, the second driver circuit 2412 may provide the first power voltage VPP or the second power voltage VRFT under the control of the second shared switch circuit 2432.

The unselected pass transistor driver 2420 may provide gate voltage to the third and fourth pass transistors (PS3, PS4). The unselected pass transistor driver 2420 may include a third driver circuit 2421 ("Driver Circuit 3 (2421)"), a fourth driver circuit 2422 ("Driver Circuit 4 (2422)"), and an unselected switch circuit 2423.

The third driver circuit 2421 may provide the power voltage or ground voltage to the third pass transistor PS3 according to the third enable signal EN3. When the third enable signal EN3 is at a high level, the third driver circuit 2421 may provide a ground voltage to the third pass transistor PS3. When the third enable signal EN3 is at a low level and the second switch signal SW2 is input, the third driver circuit 2421 may provide the first power voltage VPP or the second power voltage VRFT under the control of the first shared switch circuit 2431.

The fourth driver circuit 2422 may provide the power voltage or ground voltage to the fourth pass transistor PS4 according to the fourth enable signal EN4. When the fourth enable signal EN4 is at a high level, the fourth driver circuit 2422 may provide a ground voltage. When the fourth enable signal EN4 is at a low level, the fourth driver circuit 2422 may provide the first power voltage VPP or the second power voltage VRFT under the control of the second shared switch circuit 2432.

The first shared switch circuit 2431 may receive a third switch signal SW3 and a fourth switch signal SW4 from the control logic 1160, and provide the first power voltage VPP or the second power voltage VFRT to the first and/or third driver circuits (2411, 2421). The first shared switch circuit

2431 may provide the first power voltage VPP when the third switch signal SW3 is input, and provide the second power voltage VFRT when the fourth switch signal SW4 is input.

The second shared switch circuit 2432 may receive a fifth switch signal SW5 and a sixth switch signal SW6 from the control logic 1160, and provide the first power voltage VPP or the second power voltage VFRT to the second and fourth driver circuits (2412, 2422). The second shared switch circuit 2432 may provide the first power voltage VPP when the fifth switch signal SW5 is input, and provide the second power voltage VFRT when the sixth switch signal SW6 is input.

The block selection circuit 2000 shown in FIG. 20 may control the first to fourth driver circuits (2411, 2412, 2421, and 2422) using the first and second shared switch circuits 2431 and 2432. The block selection circuit 2000 shown in FIG. 20 may use the first and second shared switch circuits 2431 and 2432 in common. The block selection circuit 2000 may reduce the area of the selected pass transistor driver 2410 and the unselected pass transistor driver 2420. As the number of memory blocks increases, the effect of reducing the area of the block selection circuit 2000 may be greater.

Figure 21:
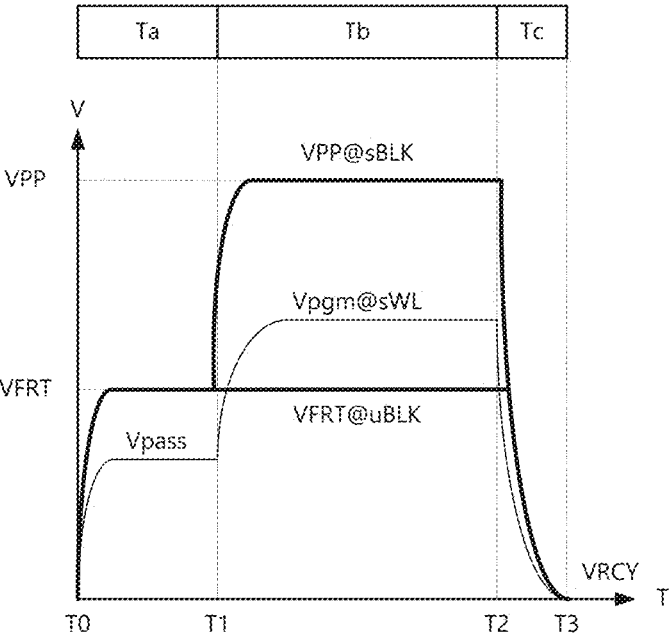
FIG. 21 is a graph illustrating an example embodiment of a program operation of the block selection circuit shown in FIG. 20.

FIG. 21 is a graph illustrating an example embodiment of a program operation of the block selection circuit shown in FIG. 20. Referring to FIG. 21, during a program operation, a pass voltage Vpass and a program voltage Vpgm may be applied to the selected word line sWL of the selected memory block sBLK. A pass voltage Vpass may be provided in the Ta time period (T0 to T1), and a program voltage Vpgm may be provided in the Tb time period (T1 to T2). And a program recovery operation may be performed in the Tc time period (T2 to T3).

In the Ta time period, the second power voltage VFRT may be provided to the gate of the first pass transistor PS1 connected to the selected memory block sBLK. The second power voltage VFRT may be provided to the gate of the third pass transistor PS3 connected to the unselected memory block uBLK.

In the Tb time period, the first power voltage VPP may be provided to the gate of the first pass transistor PS1 connected to the selected memory block sBLK to program the selected word line sWL of the selected memory block sBLK. That is, the gate voltage of the first pass transistor PS1 may change from the second power voltage VFRT to the first power voltage VPP. On the other hand, the gate voltage of the third pass transistor PS3 connected to the unselected memory block uBLK may be maintained at the second power voltage VFRT.

In the Tc time period, the recovery voltage VRCY may be provided to the gate of the first pass transistor PS1 connected to the selected memory block sBLK. Additionally, the recovery voltage VRCY may be provided to the gate of the third pass transistor PS3 connected to the unselected memory block uBLK. The recovery voltage VRCY may be provided from a recovery circuit.

FIG. 22 is a diagram illustrating example embodiments of the gate voltages of the first and third pass transistors and the on/off conditions of the first to fourth switch signals in the time periods shown in FIG. 21.

In the Ta time period, the first and second switch signals (SW1, SW2) may be ON, the third switch signal SW3 may be OFF, and the fourth switch signal SW4 may be ON. Under these switch signal conditions, the second power voltage VFRT may be applied to the gate of the first pass transistor PS1 connected to the selected memory block sBLK. The second power voltage VFRT may be applied to the gate of the third pass transistor PS3 connected to the unselected memory block uBLK.

In the Tb time period, the first switch signal SW1 may be ON, the second switch signal SW2 may be OFF, the third switch signal SW3 may be ON, and the fourth switch signal SW4 may be OFF. Under these switch signal conditions, the first power voltage VPP may be applied to the gate of the first pass transistor PS1 connected to the selected memory block sBLK. The second power voltage VFRT may be applied to the gate of the third pass transistor PS3 connected to the unselected memory block uBLK.

In the Tc period, the first and second switch signals SW1 and SW2 may be ON, and the third and fourth switch signals SW3 and SW4 may be OFF. Under these switch signal conditions, the recovery voltage VRCY may be applied to the gate of the first pass transistor PS1 connected to the selected memory block sBLK and the gate of the third pass transistor PS3 connected to the unselected memory block uBLK.

Figure 23:
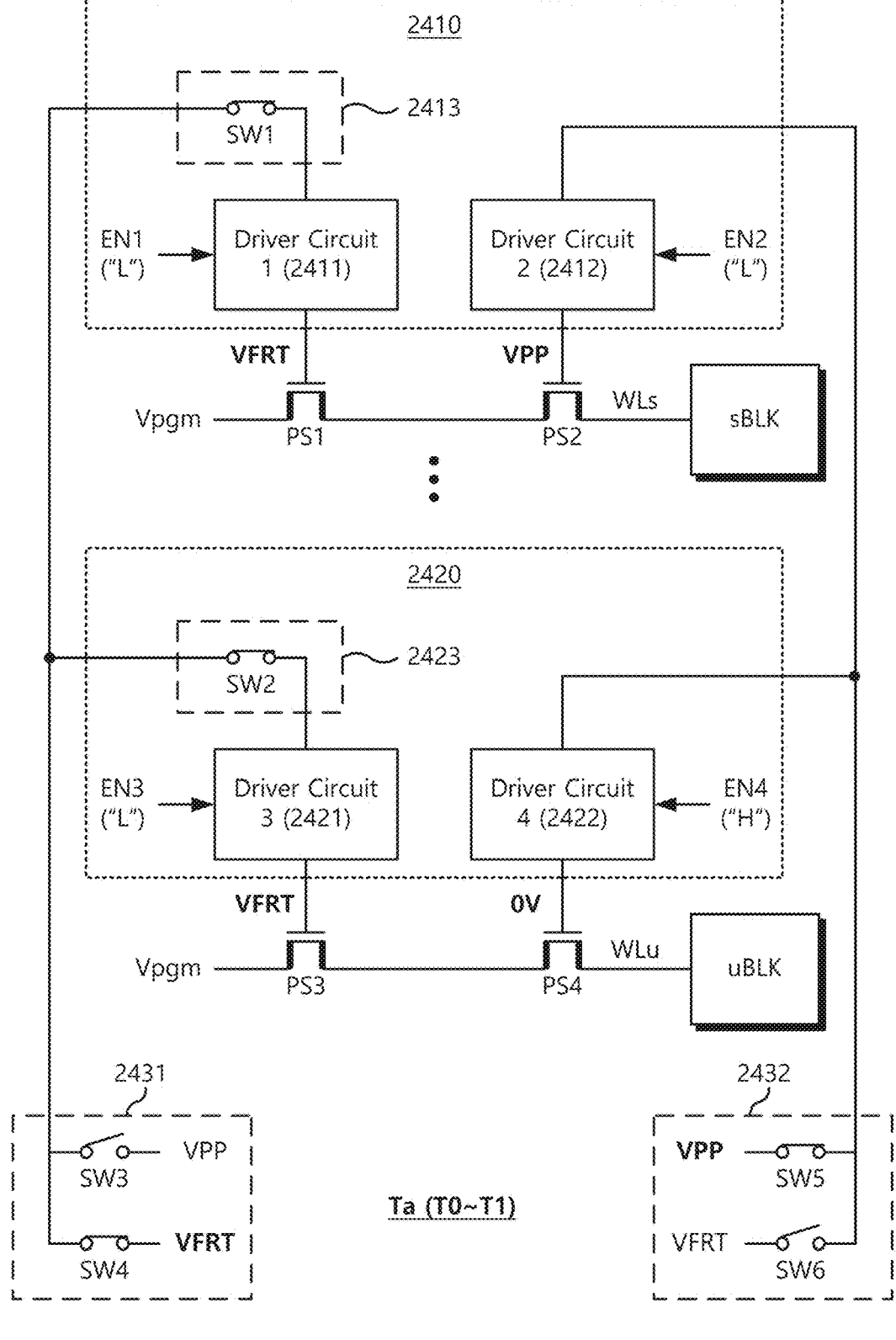
FIG. 23 is a circuit diagram illustrating an example embodiment of the gate voltages of the first to fourth pass transistors and the on-off states of the first to sixth switch signals in the Ta time period shown in FIG. 22.

FIG. 23 is a circuit diagram illustrating an example embodiment of the gate voltages of the first to fourth pass transistors and the on-off states of the first to sixth switch signals in the Ta time period shown in FIG. 22. Referring to FIG. 23, in the Ta time period, the fourth switch signal SW4 of the first shared switch circuit 2431 is ON. The second power voltage VFRT may be provide to the selected pass transistor driver 2410 and the unselected pass transistor driver 2420.

The first driver circuit 2411 may receive the second power voltage VFRT through the selected switch circuit 2413 and provide the second power voltage VFRT to the gate of the first pass transistor PS1. The third driver circuit 2421 may receive the second power voltage VFRT through the unselected switch circuit 2423 and provide the second power voltage VFRT to the gate of the third pass transistor PS3.

Since the fifth switch signal SW5 of the second shared switch circuit 2432 is ON, the first power voltage VPP may be provided to the selected pass transistor driver 2410 and the unselected pass transistor driver 2420. The second driver circuit 2412 may receive the first power voltage VPP and provide the first power voltage VPP to the gate of the second pass transistor PS2. Since the fourth enable signal EN4 is at a high level, the fourth driver circuit 2422 may provide a ground voltage (e.g., 0V) to the gate of the fourth pass transistor PS4.

Figure 24:
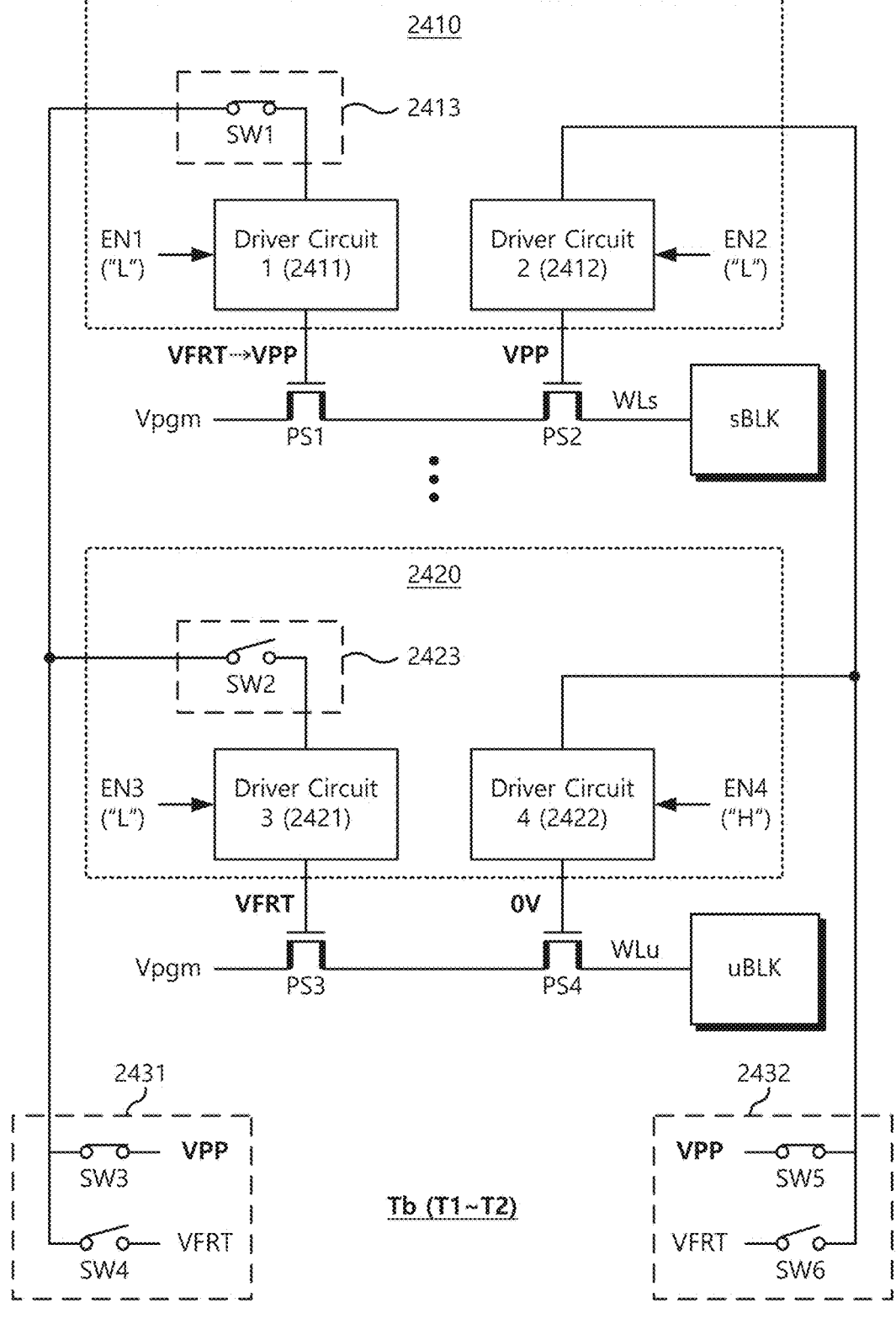
FIG. 24 is a circuit diagram illustrating an example embodiment of the gate voltages of the first to fourth pass transistors and the on-off states of the first to sixth switch signals in the Tb time period shown in FIG. 22.

FIG. 24 is a circuit diagram illustrating an example embodiment of the gate voltages of the first to fourth pass transistors and the on-off states of the first to sixth switch signals in the Tb time period shown in FIG. 22. Referring to FIG. 24, in the Tb time period, the third switch signal SW3 of the first shared switch circuit 2431 may be turned on and the fourth switch signal SW4 may be turned off.

The first power voltage VPP may be provided to the selected pass transistor driver 2410. The first driver circuit 2411 may receive the first power voltage VPP through the selected switch circuit 2413 and provide the first power voltage VPP to the gate of the first pass transistor PS1.

In the Tb time period, since the second switch signal SW2 of the unselected switch circuit 2423 is OFF, the third driver circuit 2421 may not receive the power voltage from the first shared switch circuit 2431. The power supply terminal of the third driver circuit 2421 may be in a floating state. The third driver circuit 2421 may maintain the second power voltage VERT for a certain period of time due to capacitors present at the gate of the third pass transistor PS3 and/or a parasitic capacitor component.

Figure 25:
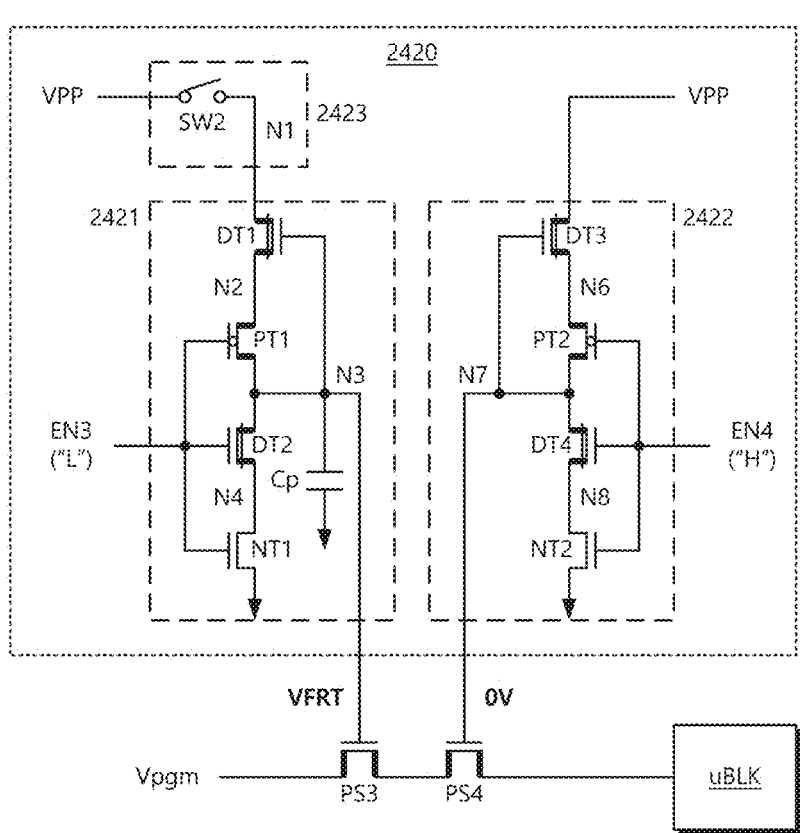
FIG. 25 is a circuit diagram illustrating an example embodiment of the unselected pass transistor driver shown in FIG. 24.

FIG. 25 is a circuit diagram illustrating an example embodiment of the unselected pass transistor driver shown in FIG. 24. Referring to FIG. 25, the unselected pass transistor driver 2420 may include a third driver circuit 2421, a fourth driver circuit 2422, and an unselected switch circuit 2423. Since the internal configuration and operating principles of the third and fourth driver circuits 2421 and 2422 are the same as those described in FIG. 6, detailed descriptions will be omitted.

The third driver circuit 2421 may provide the second power voltage VFRT to the third pass transistor PS3 through the third node N3 in the Ta time period. A capacitor Cp may exist in the third node N3. Here, the capacitor Cp may be an actually existing capacitor or a parasitic capacitor component.

In the Ta time period, both ends of the capacitor Cp present in the third node N3 may be charged with the second power voltage VFRT. In the Tb time period, the second switch signal SW2 may be OFF and the first node N1 may be in a floating state. The voltage level of the third node N3 may be maintained at the second power voltage VERT for a certain period of time by the capacitor Cp.

Figure 26:
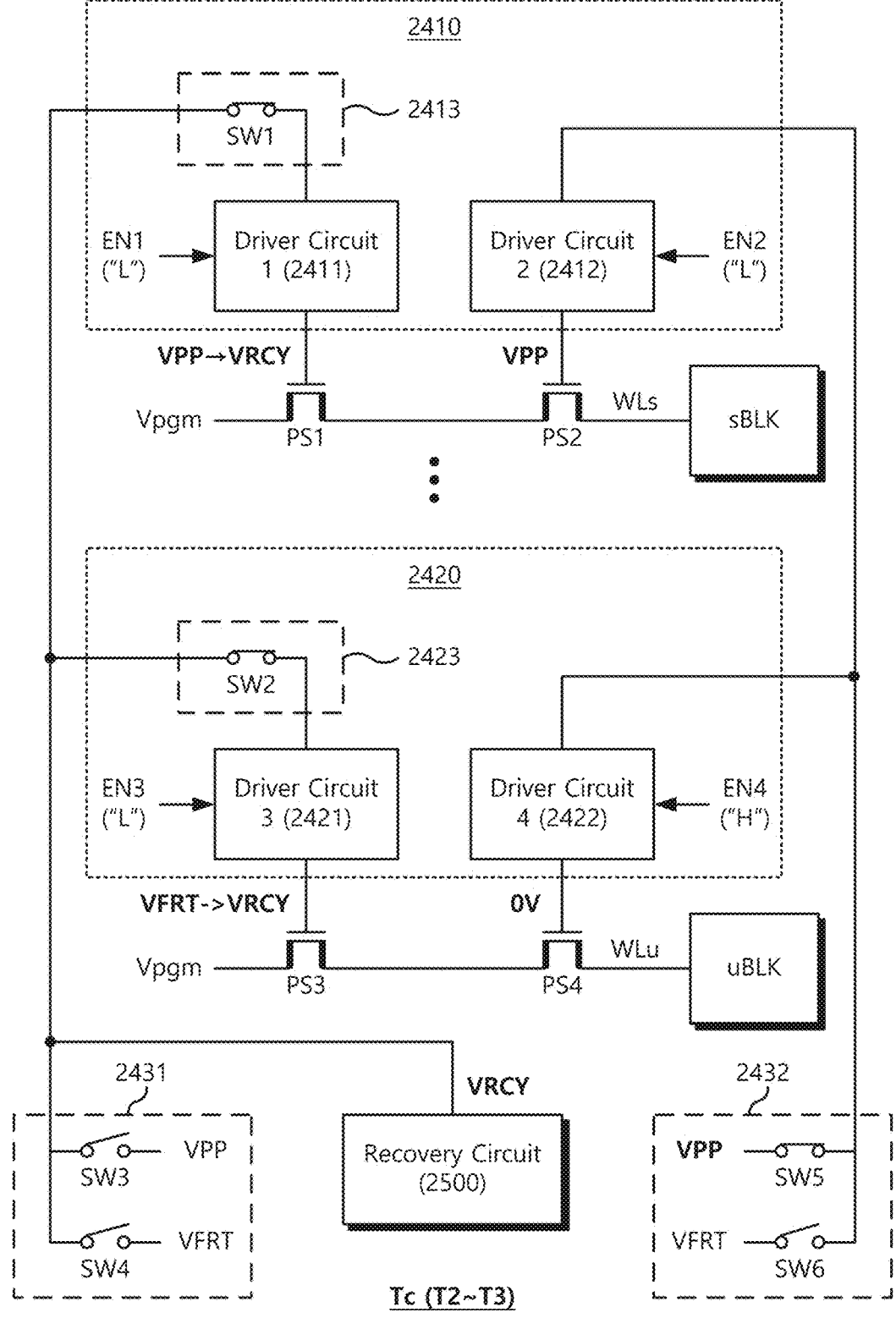
FIG. 26 is a circuit diagram illustrating an example embodiment of the gate voltages of the first to fourth pass transistors and the on-off states of the first to sixth switch signals in the Tc time period shown in FIG. 22.

FIG. 26 is a circuit diagram illustrating an example embodiment of the gate voltages of the first to fourth pass transistors and the on-off states of the first to sixth switch signals in the Tc time period shown in FIG. 22. Referring to FIG. 26, the block selection circuit 2000 may receive the recovery voltage VRCY from a recovery circuit 2500 in the Tc time period.

In the Tc time period, the third and fourth switch signals SW3 and SW4 of the first shared switch circuit 2431 may be OFF. The first and second switch signals SW1 and SW2 of the selected switch circuit 2413 and the unselected switch circuit 2423 may be ON. The first driver circuit 2411 may receive the recovery voltage VRCY through the selected switch circuit 2413 and provide the recovery voltage VRCY to the gate of the first pass transistor PS1. The third driver circuit 2421 may receive the recovery voltage VRCY through the unselected switch circuit 2423 and provide the recovery voltage VRCY to the gate of the third pass transistor PS3.

The memory device 1100 according to an embodiment of the disclosure may reduce the area of the selected pass transistor driver 2410 and the unselected pass transistor driver 2420 by using the first and second shared switch circuits 2431 and 2432. As the number of memory blocks increases, the effect of reducing the area of the block selection circuit 2000 may be greater.

Figure 27:
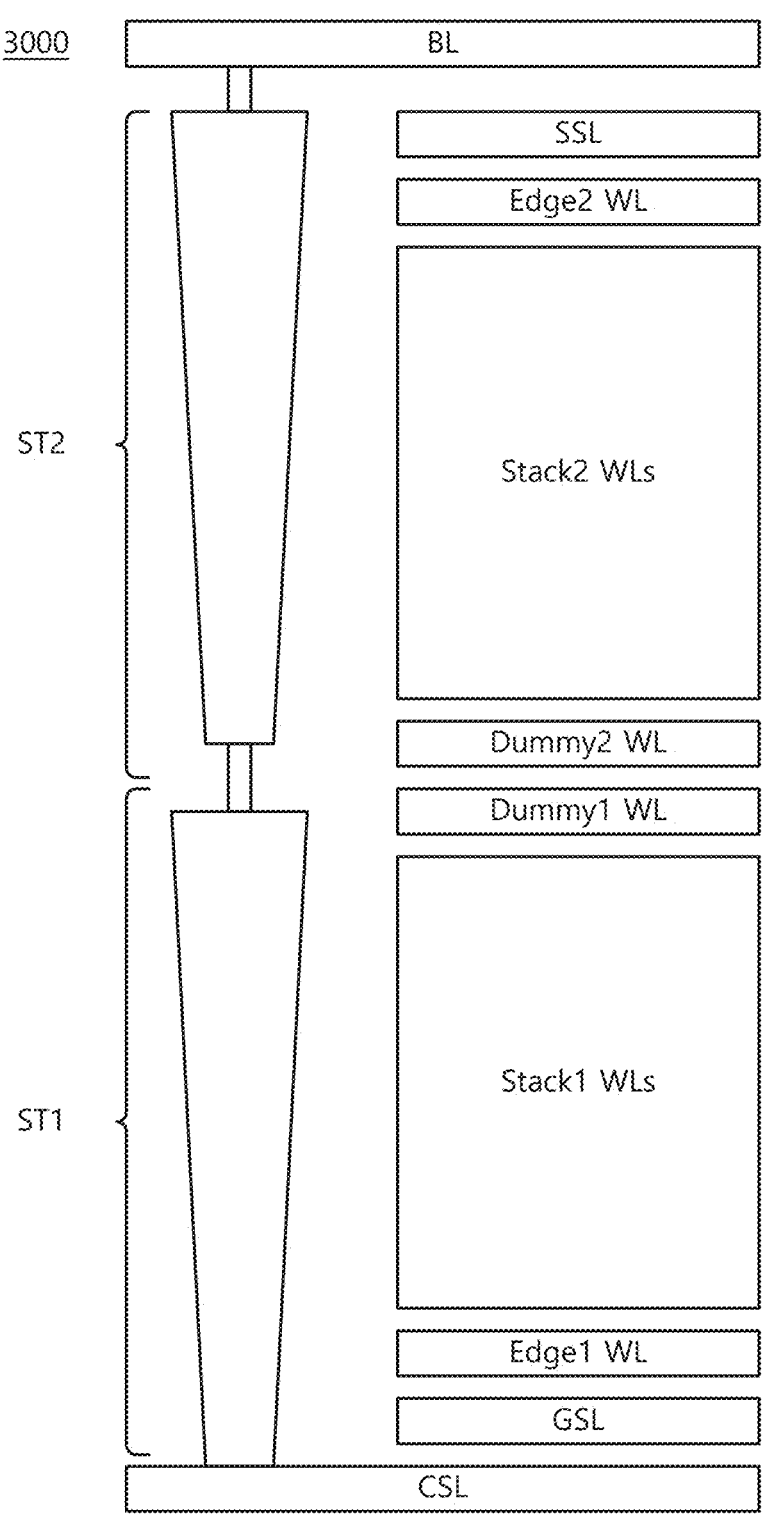
FIG. 27 is a diagram illustrating an example embodiment of a flash memory having a multi-stack structure.

FIG. 27 is a diagram illustrating an example embodiment of a flash memory having a multi-stack structure. Referring to FIG. 27, the flash memory 3000 may have a first stack ST1 and a second stack ST2. The first stack ST1 may be located at the bottom, and the second stack ST2 may be located at the top.

A pillar of the flash memory 3000 may be formed by bonding the first and second stacks ST1 and ST2. A plurality of dummy word lines (e.g., Dummy1 WL and Dummy2 WL) may be included at junctions of the first and second stacks ST1 and ST2. The first stack ST1 may be positioned between the common source line CSL and the first dummy word line Dummy1 WL. The second stack ST2 may be positioned between the second dummy word line Dummy2 WL and the bit line BL.

The first stack ST1 may include a ground selection line GSL, a first edge word line Edge1 WL, and first stack word lines Stack1 WLs. The second stack ST2 may include second stack word lines Stack2 WLs and second edge word lines Edge2 WL. Memory cells connected to the first and second edge word lines Edge1 WL and Edge2 WL may store bit data different from the other memory cells. For example, memory cells connected to the first and second edge word lines Edge1 WL and Edge2 WL may be SLC or MLC, and memory cells connected to the other word lines may be TCL or QLC.

The flash memory 3000 may control the number of memory blocks sharing the shared switch circuit differently depending on the height of the word line. For example, the flash memory 3000 may share the shared switch circuit within the same stack or between different stacks during a program or erase operation.

Figure 28:
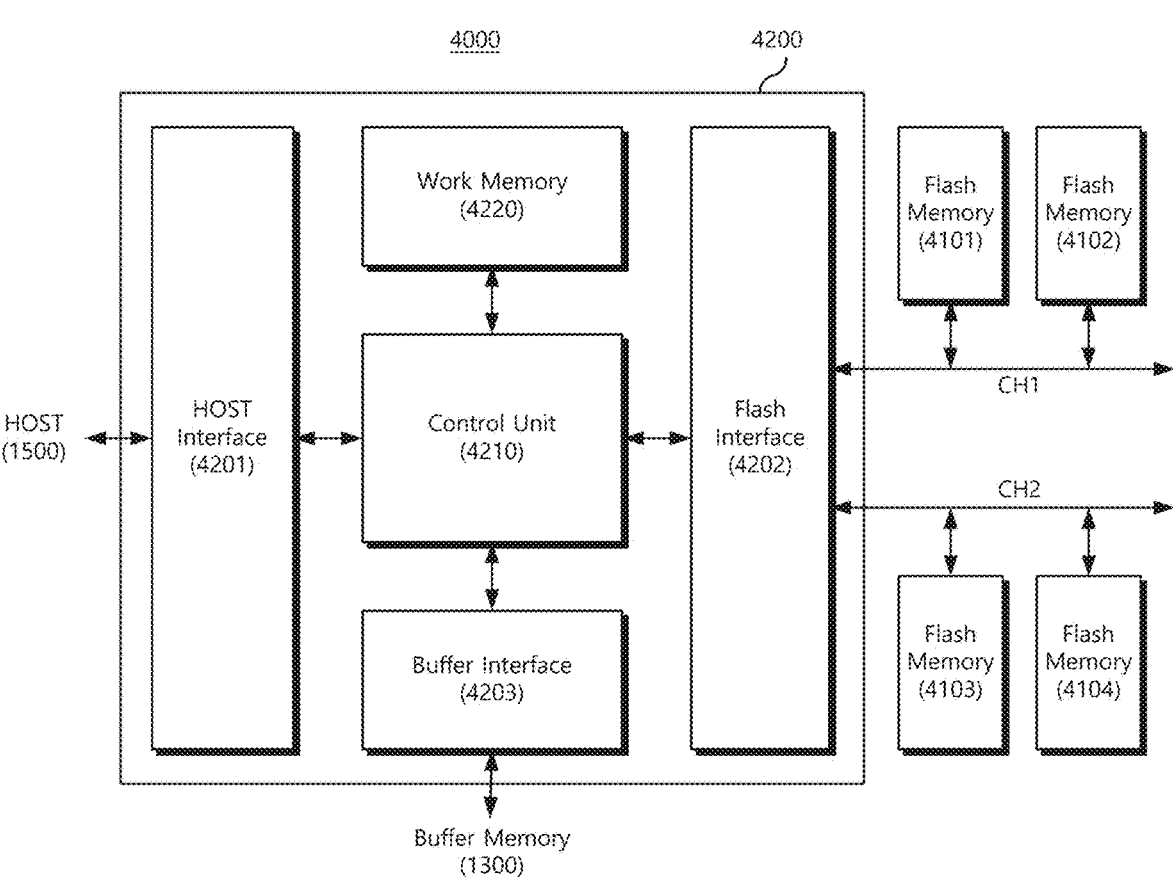
FIG. 28 is a block diagram illustrating an example in which a storage device according to an embodiment of the disclosure is implemented with a solid state drive (SSD).

FIG. 28 is a block diagram illustrating an example in which a storage device according to an embodiment of the disclosure is implemented with a solid state drive (SSD). Referring to FIG. 28, an SSD 4000 may include a plurality of flash memories 4101 to 4104 and an SSD controller 4200.

The first and second flash memories 4101 and 4102 may be connected with the SSD controller 4200 through a first channel CH1. The third and fourth flash memories 4103 and 4104 may be connected with the SSD controller 4200 through a second channel CH2. The number of channels connected with the SSD controller 4200 may be 2 or more. The number of flash memories connected with one channel may be 2 or more.

The SSD controller 4200 may include a host interface 4201, a flash interface 4202, a buffer interface 4203, a control unit 4210, and a work memory 4220. The SSD controller 4200 may be connected with a host 1500 through the host interface 4201. Depending on a request of the host 1500, the SSD controller 4200 may write data in the corresponding flash memory or may read data from the corresponding flash memory.

The SSD controller 4200 may be connected with the plurality of flash memories 4101 to 4104 through the flash interface 4202 and may be connected with a buffer memory 1300 through the buffer interface 4203. The flash interface 4202 may provide data, which are temporarily stored in the buffer memory 1300, to the flash memories through the channels CH1 and CH2. The flash interface 4202 may transfer the data read from the flash memories 4101 to 4104 to the buffer memory 1300.

The control unit 4210 may analyze and process the signal received from the host 1500. The control unit 4210 may control the host 1500 or the flash memories 4101 to 4104 through the host interface 4201 or the flash interface 4202. The control unit 4210 may control operations of the flash memories 4101 to 4104 by using firmware for driving the SSD 4000.

The SSD controller 4200 may manage data to be stored in the flash memories 4101 to 4104. In the sudden power-off event, the SSD controller 4200 may back the data stored in the work memory 4220 or the buffer memory 1300 up to the flash memories 4101 to 4104.

According to the disclosure, it may be possible to reduce a test time taken to perform the margin read test operation and to perform the margin read test operation in high speed.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A flash memory comprising:
a plurality of memory blocks, each of the plurality of memory blocks being respectively connected to a plurality of word lines and being respectively connected to a pass transistor driver;
an address decoder configured to provide at least one voltage to the plurality of word lines connected to a memory block of the plurality of memory blocks;
a first pass transistor connected to the address decoder;
a second pass transistor connected in series with the first pass transistor, the second pass transistor being connected between a word line among the plurality of word lines connected to the memory block and the first pass transistor;
a first driver circuit configured to control a gate voltage of the first pass transistor based on a first enable signal;
a second driver circuit configured to control a gate voltage of the second pass transistor based on a second enable signal;
a first switch circuit configured to provide a first power voltage or a second power voltage to a gate of the first pass transistor through the first driver circuit based on a first switch signal; and
a second switch circuit configured to be shared by the plurality of memory blocks and provide the first power voltage or the second power voltage to the first switch circuit,
wherein the first power voltage is higher than the second power voltage.

2. The flash memory of claim 1, wherein, when the memory block is a selected memory block, in a first time period of a program operation, the first driver circuit is further configured to provide the second power voltage to the gate of the first pass transistor, and the second driver circuit is further configured to provide the first power voltage to the gate of the second pass transistor.

3. The flash memory of claim 2, wherein, when the memory block is an unselected memory block, in the first time period of the program operation, the first driver circuit is further configured to provide the second power voltage to the gate of the first pass transistor, and the second driver circuit is further configured to provide a ground voltage to the gate of the second pass transistor.

4. The flash memory of claim 3, wherein, in the first time period of the program operation, the first switch signal of the first switch circuit is in an on state in a case of the selected memory block, and the first switch signal is in an on state in a case of the unselected memory block.

5. The flash memory of claim 4, wherein, during the program operation, in the case of the selected memory block, the first driver circuit is further configured to provide the first power voltage to the gate of the first pass transistor in a second time period following the first time period, and
wherein, during the program operation, in the case of the unselected memory block, the first driver circuit is further configured to provide the second power voltage to the gate of the first pass transistor in the second time period.

6. The flash memory of claim 5, wherein, in the second time period of the program operation, the first switch signal of the first switch circuit is in an on state in the case of the selected memory block, and the first switch signal is in an off state in the case of the unselected memory block.

7. The flash memory of claim 1, further comprising a third switch circuit configured to be shared by the plurality of memory blocks, and provide the first power voltage or the second power voltage to the gate of the second pass transistor through the second driver circuit.

8. The flash memory of claim 1, wherein, when the word line connected to the second pass transistor is connected to an unselected memory block during a program operation, the first driver circuit is further configured to provide the second power voltage to the gate of the first pass transistor, and the second driver circuit is further configured to control the second pass transistor to be in a floating state.

9. The flash memory of claim 8, wherein, when the memory block is a selected memory block during the program operation, the first driver circuit is further configured to provide controls the gate voltage of the first pass transistor to change from the second power voltage to the first power voltage, and the second driver circuit is further configured to control the first power voltage to be provided to the gate of the second pass transistor.

10. The flash memory of claim 1, wherein, when the memory block is an unselected memory block during an erase operation, the first enable signal causes the first pass transistor to be in a floating state, and the second enable signal causes the second power voltage to be applied to the gate of the second pass transistor.

11. A block selection circuit of a flash memory, comprising:

a first pass transistor connected to an address decoder;

a second pass transistor connected in series with the first pass transistor and between a memory block of a plurality of memory blocks and the first pass transistor, wherein each of the plurality of memory blocks is connected to a respective pass transistor driver;

a first driver circuit configured to control a gate voltage of the first pass transistor based on a first enable signal;

a second driver circuit configured to control a gate voltage of the second pass transistor based on a second enable signal;

a first switch circuit configured to provide a first power voltage or a second power voltage to a gate of the first pass transistor through the first driver circuit based on a first switch signal; and a second switch circuit configured to be shared by the plurality of memory blocks and provide the first power voltage or the second power voltage to the first switch circuit, wherein the first power voltage is higher than the second power voltage.

12. The block selection circuit of claim 11, further comprising a third switch circuit configured to be shared by the plurality of memory blocks, and provide the first power voltage or the second power voltage to the gate of the second pass transistor through the second driver circuit.

13. The block selection circuit of claim 11, wherein, when the memory block is a selected memory block, during a program operation, the first driver circuit is further configured to control the gate voltage of the first pass transistor to change from the second power voltage to the first power voltage, and the second driver circuit is further configured to control the first power voltage to be provided to the gate of the second pass transistor.

14. The block selection circuit of claim 11, wherein, when the memory block is an unselected memory block, during a program operation, the first driver circuit is further configured to control the second power voltage to be provided to the gate of the first pass transistor, and the second driver circuit is further configured to control the second pass transistor to be in a floating state.

15. The block selection circuit of claim 11, wherein, when the memory block is an unselected memory block, during an erase operation, the first enable signal causes the first pass transistor to be in a floating state, and the second enable signal causes the second power voltage to be applied to the gate of the second pass transistor.

16. The block selection circuit of claim 11, wherein, when the memory block is a selected memory block, in a first time period, the first driver circuit is further configured to provide the second power voltage to the gate of the first pass transistor, and in a second time period following the first time period, the first driver circuit is further configured to provide the first power voltage to the gate of the first pass transistor.

17. The block selection circuit of claim 16, wherein, when the memory block is the selected memory block, the second driver circuit is further configured to provide the first power voltage to the gate of the second pass transistor during the first time period and the second time period.

18. The block selection circuit of claim 17, wherein, when the memory block is an unselected memory block, the first driver circuit is further configured to maintain the second power voltage at the gate of the first pass transistor during the first time period and the second time period.

19. A block selection circuit of a flash memory, the block selection circuit comprising:

a first pass transistor connected to an address decoder;

a second pass transistor connected in series with the first pass transistor and between a memory block of a plurality of memory blocks and the first pass transistor, wherein each of the plurality of memory blocks is connected to a respective pass transistor driver;

a first driver circuit configured to control a gate voltage of the first pass transistor based on a first enable signal;

a second driver circuit configured to control a gate voltage of the second pass transistor based on a second enable signal;

a switch circuit configured to provide a first power voltage or a second power voltage lower than the first power voltage to a gate of the first pass transistor through the first driver circuit based on a first switch signal;

a first shared switch circuit configured to be shared by the plurality of memory blocks and provide the first power voltage or the second power voltage to the switch circuit; and a second shared switch circuit configured to be shared by the plurality of memory blocks and provide the first power voltage or the second power voltage to the gate of the second pass transistor through the second driver circuit, wherein, when the memory block is a selected memory block, during a program operation, the first driver circuit is further configured to control the gate voltage of the first pass transistor to change from the second power voltage to the first power voltage, and the second driver circuit is further configured to control the first power voltage to be provided to the gate of the second pass transistor.

20. The block selection circuit of claim 19, wherein, when the memory block connected to the second pass transistor is an unselected memory block, during the program operation, the first driver circuit is further configured to control the second power voltage to be provided to the gate of the first pass transistor, and the second driver circuit is further configured to control the second pass transistor to be in a floating state.

* * * * *